United States Patent
Hatakeyama et al.

(10) Patent No.: US 7,642,034 B2
(45) Date of Patent: Jan. 5, 2010

(54) POLYMER, RESIST PROTECTIVE COATING MATERIAL, AND PATTERNING PROCESS

(75) Inventors: Jun Hatakeyama, Joetsu (JP); Koji Hasegawa, Joetsu (JP); Yuji Harada, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/699,485

(22) Filed: Jan. 30, 2007

(65) Prior Publication Data

US 2007/0178407 A1 Aug. 2, 2007

(30) Foreign Application Priority Data

Jan. 31, 2006 (JP) .............................. 2006-022351
Aug. 30, 2006 (JP) .............................. 2006-232910

(51) Int. Cl.
G03F 7/00 (2006.01)
G03F 7/004 (2006.01)
C08F 218/00 (2006.01)

(52) U.S. Cl. .................. 430/270.1; 430/271.1; 526/245; 526/250

(58) Field of Classification Search ............. 430/270.1, 430/273.1, 326, 271.1; 526/242, 252, 253, 526/281, 247, 245, 250
See application file for complete search history.

(56) References Cited

U.S. PATENT DOCUMENTS

| | | | |
|---|---|---|---|
| 5,541,037 A | | 7/1996 | Hatakeyama et al. |
| 5,550,004 A | * | 8/1996 | Honda ...................... 430/270.1 |
| 6,869,744 B2 | | 3/2005 | Hatakeyama et al. |
| 2003/0021671 A1 | * | 1/2003 | Edo ............................ 414/939 |
| 2003/0078352 A1 | * | 4/2003 | Miyazawa et al. ........... 526/245 |
| 2003/0224283 A1 | * | 12/2003 | Allen et al. ............... 430/270.1 |
| 2004/0096757 A1 | * | 5/2004 | Tokuda et al. .................. 430/8 |
| 2004/0214102 A1 | * | 10/2004 | DiPietro et al. .......... 430/270.1 |
| 2005/0175776 A1 | * | 8/2005 | Streefkerk et al. ........... 427/256 |
| 2005/0250898 A1 | | 11/2005 | Maeda et al. |
| 2006/0252897 A1 | | 11/2006 | Miyazawa et al. |
| 2006/0292458 A1 | * | 12/2006 | Tsutsui et al. .................... 430/5 |
| 2007/0031755 A1 | * | 2/2007 | Hirayama et al. ......... 430/270.1 |
| 2007/0087125 A1 | * | 4/2007 | Maeda et al. ................ 427/402 |
| 2007/0087285 A1 | * | 4/2007 | Huang et al. ............. 430/270.1 |
| 2007/0122741 A1 | * | 5/2007 | Hatakeyama et al. .... 430/270.1 |
| 2008/0085466 A1 | * | 4/2008 | Harada et al. ............ 430/270.1 |

FOREIGN PATENT DOCUMENTS

| | | |
|---|---|---|
| JP | 60-33821 A | 2/1985 |
| JP | 62-62520 A | 3/1987 |
| JP | 62-62521 A | 3/1987 |
| JP | 5-74700 A | 3/1993 |
| JP | 6-273926 A | 9/1994 |
| JP | 2803549 B2 | 7/1998 |
| JP | 2002-99090 A | 4/2002 |
| JP | 2003-40840 A | 2/2003 |
| JP | 2005-316352 A | 11/2005 |
| WO | WO 2004/014960 | * 2/2004 |
| WO | WO 2005/019937 | * 3/2005 |

OTHER PUBLICATIONS

Lin, Proc. SPIE, vol. 4690, xxix.
Owa et al., Proc. SPIE, vol. 5040, (2003), pp. 724.
Hirayama, The 2nd Immersion Workshop, Resist and Cover Material Investigation for Immersion Lithography, Jul. 11, 2003.
Allen et al., Journal of Photopolymer Science and Technology, vol. 18, No. 5, (2005), pp. 615-619.

* cited by examiner

*Primary Examiner*—Cynthia H Kelly
*Assistant Examiner*—Anca Eoff
(74) *Attorney, Agent, or Firm*—Birch, Stewart, Kolasch & Birch, LLP

(57) ABSTRACT

A polymer comprising repeat units having formula (1) wherein $R^1$ and $R^2$ are hydrogen or $C_1$-$C_{12}$ alkyl, or $R^1$ and $R^2$ may bond together to form a ring, and $R^{30}$ is hydrogen or methyl is used to formulate a resist protective coating material. A protective coating formed therefrom on a resist film is water-insoluble, dissolvable in alkali aqueous solution or alkaline developer, and immiscible with the resist film so that the immersion lithography can be conducted in a satisfactory manner. During alkali development, development of the resist film and removal of the protective coating can be simultaneously achieved.

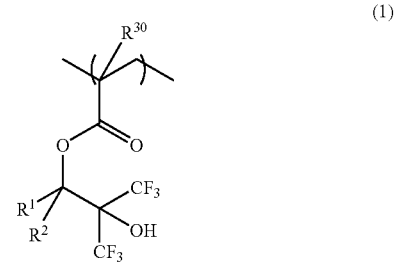

(1)

8 Claims, No Drawings

POLYMER, RESIST PROTECTIVE COATING MATERIAL, AND PATTERNING PROCESS

CROSS-REFERENCE TO RELATED APPLICATION

This non-provisional application claims priority under 35 U.S.C. §119(a) on patent application Nos. 2006-022351 and 2006-232910 filed in Japan on Jan. 31, 2006 and Aug. 30, 2006, respectively, the entire contents of which are hereby incorporated by reference.

TECHNICAL FIELD

This invention generally relates to a micropatterning process for the fabrication of semiconductor devices, and particularly to an immersion photolithography process involving directing ArF excimer laser radiation having a wavelength of 193 nm from a projection lens toward a wafer, with water intervening between the lens and the wafer. More particularly, it relates to a resist protective coating material used as a resist overlay for protecting a photoresist layer and a process for forming a resist pattern using the same. It also relates to a polymer useful as the resist overlay coating material.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used. One means believed effective for smaller the feature size is shorter the wavelength of exposure light. For the mass production process of 64 M-bit dynamic random access memory (DRAM, processing feature size 0.25 μm or less), the exposure light source of i-line (365 nm) was replaced by a KrF excimer laser having a shorter wavelength of 248 nm. However, for the fabrication of DRAM with a degree of integration of 256 M and 1 G or more requiring a finer patterning technology (processing feature size 0.2 μm or less), a shorter wavelength light source is required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the postponement of $F_2$ lithography and the early introduction of ArF immersion lithography were advocated (see Proc. SPIE Vol. 4690 xxix).

In the ArF immersion lithography, the space between the projection lens and the wafer is filled with water. Since water has a refractive index of 1.44 at 193 nm, pattern formation is possible even using a lens with NA of 1.0 or greater. Theoretically, it is possible to increase the NA to 1.44. The resolution is improved by an increment of NA. A combination of a lens having NA of at least 1.2 with ultra-high resolution technology suggests a way to the 45-nm node (see Proc. SPIE Vol. 5040, p 724).

Several problems associated with the presence of water on resist were pointed out. For example, profile changes occur because the acid once generated from a photoacid generator and the amine compound added to the resist as a quencher can be dissolved in water. The pattern collapses due to swelling. It was then proposed to provide a protective coating between the resist and water (see the 2nd Immersion Workshop, Jul. 11, 2003, Resist and Cover Material Investigation for Immersion Lithography).

In the lithography history, the protective coating on the resist layer was studied as an antireflective coating. For example, the antireflective coating on resist (ARCOR) process is disclosed in JP-A 62-62520, JP-A 62-62521, and JP-A 60-38821. The ARCOR process involves forming a transparent antireflective coating on top of a resist film and stripping it after exposure. Despite its simplicity, the process can form a micropattern at a high degree of definition, precision and alignment. When the antireflective coating is made of perfluoroalkyl compounds (e.g., perfluoroalkyl polyethers or perfluoroalkyl amines) having a low refractive index, the light reflection at the resist/antireflective coating interface is minimized so that the dimensional precision is improved. In addition to these materials, the fluorinated materials proposed thus far include amorphous polymers such as perfluoro(2,2-dimethyl-1,3-dioxol)-tetrafluoroethylene copolymers and cyclic polymers of perfluoro(allyl vinyl ether) and perfluorobutenyl vinyl ether as disclosed in JP-A 5-74700.

Because of their low compatibility with organic substances, the foregoing perfluoroalkyl compounds must be diluted with fluorocarbon solvents such as Freon for controlling a coating thickness. As is well known in the art, the use of fluorocarbons now raises an issue from the standpoint of environmental protection. The perfluoroalkyl compounds are awkward to form uniform films, and are not regarded satisfactory as antireflective films. Additionally, the antireflective films must be stripped with fluorocarbon solvents prior to the development of photoresist. These factors lead to serious practical disadvantages including a need to add an antireflective film-stripping unit to the existing system and the increased cost of fluorocarbon solvents.

If the antireflective film is to be stripped without adding an extra unit to the existing system, it is most desirable to carry out stripping in the development unit. The solutions used in the photoresist development unit are an alkaline aqueous solution as the developer and deionized water as the rinse. It would be desirable to have an antireflective coating material which can be readily stripped with such solutions. For this reason, there were proposed a number of water-soluble antireflective coating materials and patterning processes using the same. See, for example, JP-A 6-273926 and Japanese Patent No. 2,803,549.

The water-soluble protective coatings, however, cannot be used in the immersion lithography because they are dissolved away in water during light exposure. On the other hand, water-insoluble fluoro-polymers pose a need for special fluorocarbon strippers and an exclusive stripping cup for fluorocarbon solvents. It was thus desired to have a resist protective coating which is water insoluble, but can be readily stripped.

Studies have been made to use methacrylate polymers having hexafluoroalcohol groups as a resist protective coating for the immersion lithography because of their alkali solubility and high water repellency (see Journal of Photopolymer Science and Technology, Vol. 18, No. 5 (2005) p 615-619). For example, JP-A 2003-040840 describes acrylate derivatives having hexafluoroalcohol. JP-A 2005-316352 describes resist protective coatings using (meth)acrylate or norbornene derivatives having hexafluoroalcohol.

There exists a demand for a resist protective coating which is more hydrophobic and alkali developable.

Another problem is that the resist undergoes changes in sensitivity while it is held in vacuum for a long time during electron beam exposure for mask image writing or the like. The resist sensitivity changes due to evaporation of the acid generated during image writing, evaporation of vinyl ether produced by deprotection of acetal protective groups by the acid, or the like, as discussed in JP-A 2002-99090. Resists for use with mask blanks must be stable for several months after coating. It is desired to have a resist for use with mask blanks which remains stable in the environment.

SUMMARY OF THE INVENTION

An object of the invention is to provide a resist protective coating material which is best suited for the immersion lithography in that it enables effective pattern formation by the immersion lithography, it can be removed at the same time as the development of a photoresist layer, and it has improved process compatibility; a pattern forming process using the same; and a polymer useful as the resist protective coating material.

The inventors have discovered that when a film of a polymer having a partial structure of the general formula (2) including a polymer having repeat units of the general formula (1) or (1)-1, all shown below, is formed on a resist film as a resist protective coating, this protective coating (or resist overlay) is insoluble in water, dissolvable in alkali aqueous solution and immiscible with the resist film, so that it can be simultaneously stripped altogether during development of the resist film in alkaline water. This protective coating has a wider range of process applicability.

Accordingly, the present invention provides a novel polymer, a resist protective coating material, and a pattern forming process, as defined below.

In a first aspect, the invention provides a polymer comprising repeat units having the general formula (1):

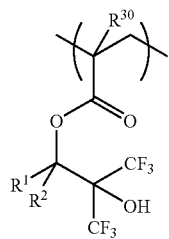

(1)

wherein $R^1$ and $R^2$ are each independently hydrogen or a straight, branched or cyclic $C_1$-$C_{12}$ alkyl group, or $R^1$ and $R^2$ may bond together to form a ring with the carbon atom to which they are attached, and $R^{30}$ is hydrogen or methyl.

The invention also provides a polymer comprising repeat units having the general formula (1)-1:

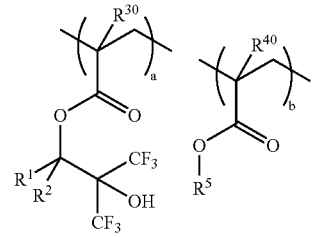

(1)-1 wherein $R^1$ and $R^2$ each are hydrogen or a straight, branched or cyclic $C_1$-$C_{12}$ alkyl group, or $R^1$ and $R^2$ may bond together to form a ring with the carbon atom to which they are attached, $R^{30}$ and $R^{40}$ each are hydrogen or methyl, $R^5$ is a straight or branched $C_2$-$C_{10}$ alkyl group having at least one fluorine atom substituted thereon, the subscripts "a" and "b" are numbers in the range: 0<a<1, 0<b<1, and 0<a+b≦1.

In a second aspect, the invention provides a resist protective coating material comprising a polymer having a partial structure of the general formula (2):

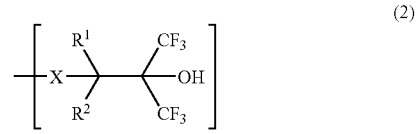

(2)

wherein $R^1$ and $R^2$ each are hydrogen or a straight, branched or cyclic $C_1$-$C_{12}$ alkyl group, or $R^1$ and $R^2$ may bond together to form a ring with the carbon atom to which they are attached, and X is —O— or —C(=O)—O—.

In a preferred embodiment, the resist protective coating material comprises a polymer comprising repeat units having the general formula (3):

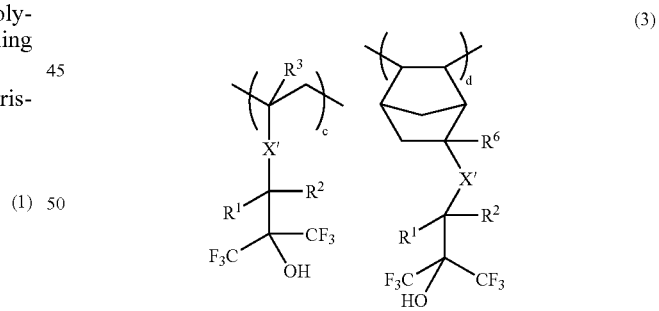

(3)

wherein $R^1$ and $R^2$ are as defined above, $R^3$ and $R^6$ each are hydrogen, fluorine, methyl or trifluoromethyl, X' is —O—, —C(=O)—O— or —C(=O)—O—$R^7$—C(=O)—, wherein $R^7$ is a straight, branched or cyclic $C_1$-$C_{10}$ alkyl group, and the subscripts "c" and "d" are numbers in the range: 0≦c≦1, 0≦d≦1, and 0<c+d≦1.

The polymer may further comprise repeat units of one or more type selected from repeat units containing carboxyl groups, repeat units containing fluoroalcohol other than formula (3), and repeat units containing fluoroalkyl or alkyl groups.

In a preferred embodiment, the resist protective coating material further comprises a solvent for dissolving the polymer. Specifically, the solvent comprises an ether compound of 8 to 12 carbon atoms and preferably di-n-pentyl ether, diisopentyl ether or a mixture thereof. The solvent may further comprise 0.1 to 90% by weight of a higher alcohol of 4 to 10 carbon atoms in admixture with the ether compound of 8 to 12 carbon atoms.

In a third aspect, the invention provides a lithography process for forming a pattern, comprising the steps of forming a protective coating on a photoresist layer disposed on a wafer from a resist overlay material, exposing the layer structure to light, and developing, the resist overlay material being the resist protective coating material defined above.

Another embodiment of the third aspect is an immersion lithography process for forming a pattern, comprising the steps of forming a protective coating on a photoresist layer disposed on a wafer from a resist overlay material, exposing the layer structure in water to light, and developing, the resist overlay material being the resist protective coating material defined above. In a preferred embodiment, the exposing step includes irradiating light having a wavelength in the range of 180 to 250 nm to the layer structure through a projection lens while keeping water between the projection lens and the wafer. Also preferably, the developing step is to develop the photoresist layer and strip the protective coating of resist overlay material at the same time, using a liquid alkaline developer.

A further embodiment of the third aspect is a lithography process for forming a pattern, comprising the steps of forming a protective coating on a photoresist layer disposed on a mask blank from a resist overlay material, exposing the layer structure in vacuum to electron beam, and developing, the resist overlay material being the resist protective coating material defined above.

BENEFITS OF THE INVENTION

In the pattern-forming process using the resist protective coating material of the invention, since the protective coating formed on the resist film is water-insoluble, dissolvable in alkali aqueous solution or alkaline developer, and immiscible with the resist film, the immersion lithography can be conducted in a satisfactory manner. During alkali development, both development of the resist film and removal of the protective coating can be simultaneously achieved.

DESCRIPTION OF THE PREFERRED EMBODIMENTS

The present invention may be understood more readily by reference to the following detailed description of preferred embodiments of the invention and the examples included herein. In this specification and in the claims which follow, reference will be made to a number of terms which shall be defined to have the following meanings.

The singular forms "a", "an" and "the" include plural referents unless the context clearly dictates otherwise.

The notation (Cn-Cm) means a group containing from n to m carbon atoms per group.

Polymer

The polymer or high molecular weight compound of the invention comprises repeat units having the general formula (1).

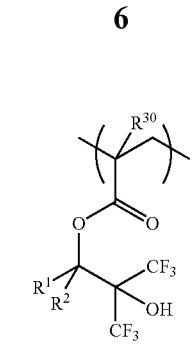

Herein $R^1$ and $R^2$, which may be the same or different, are each independently a hydrogen atom or a straight, branched or cyclic $C_1$-$C_{12}$ alkyl group. Alternatively, $R^1$ and $R^2$ may bond together to form a ring with the carbon atom to which they are attached, the ring preferably having 3 to 20 carbon atoms, more preferably 3 to 10 carbon atoms, and specifically cycloaliphatic. $R^{30}$ is a hydrogen atom or methyl group.

In one embodiment, the polymer consists of repeat units of formula (1). In another embodiment, the polymer comprises repeat units of formula (1) and repeat units of other type. In the other embodiment, the preferred polymer comprises repeat units having the formula (1)-1.

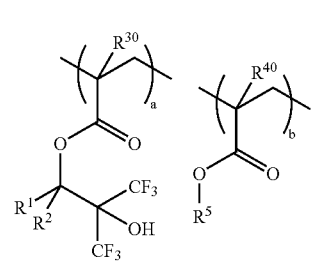

Herein $R^1$ and $R^2$ each are a hydrogen atom or a straight, branched or cyclic $C_1$-$C_{12}$ alkyl group, or $R^1$ and $R^2$ may bond together to form a ring with the carbon atom to which they are attached, the ring preferably having 3 to 20 carbon atoms, more preferably 3 to 10 carbon atoms, and specifically cycloaliphatic. Each of $R^{30}$ and $R^{40}$ is a hydrogen atom or methyl group. $R^5$ is a straight or branched $C_2$-$C_{10}$ alkyl group having at least one fluorine atom substituted thereon. The subscripts "a" and "b" are numbers in the range: $0<a<1$, $0<b<1$, and $0<a+b\leq 1$.

It is noted that "a" and "b" denote proportions of corresponding repeat units in a polymer. The meaning of a+b=1 is that in a polymer comprising repeat units "a" and "b", the total of repeat units "a" and "b" is 100 mol % based on the total amount of entire repeat units. The meaning of a+b<1 is that the total of repeat units "a" and "b" is less than 100 mol % based on the total amount of entire repeat units, that is, other repeat units are present in addition to repeat units "a" and "b".

Where $R^1$ and $R^2$ bond together to form a ring with the carbon atom to which they are attached, suitable rings include cyclopentyl, cyclohexyl, and norbornyl.

Illustrative, non-limiting examples of the repeat units of formula (1) or the repeat units "a" in formula (1)-1 are given below.

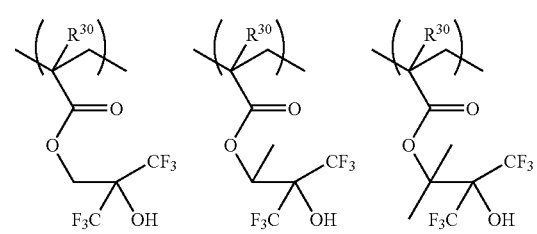
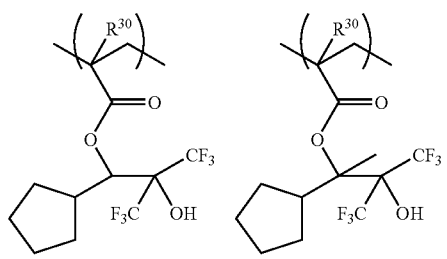
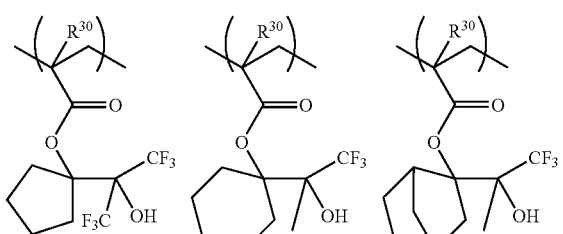
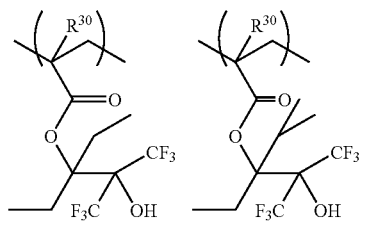
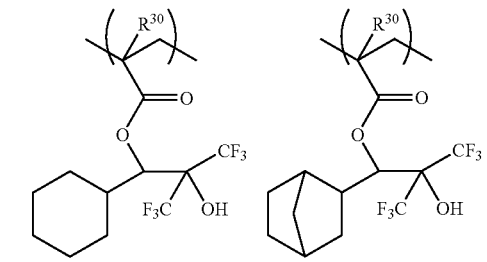
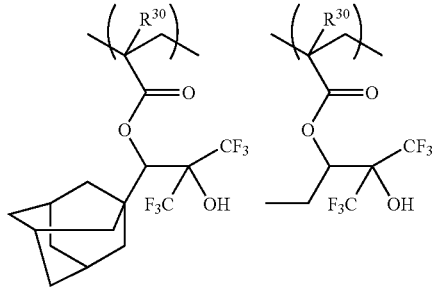
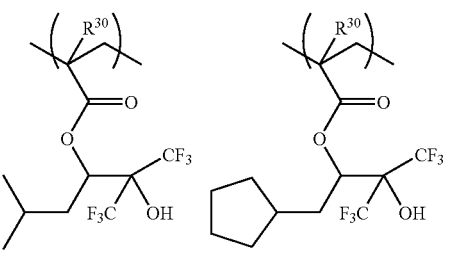
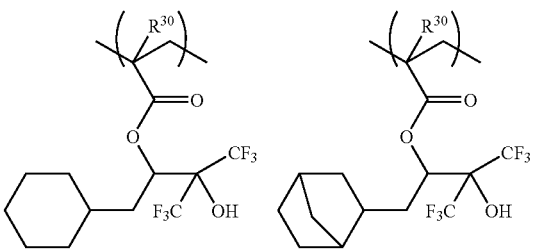
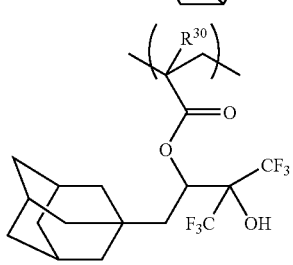
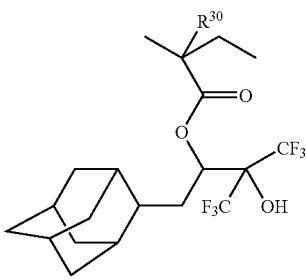
Note that $R^{30}$ is as defined above.
Illustrative, non-limiting examples of $R^5$ in the repeat units "b" in formula (1)-1 are given below.
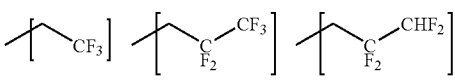
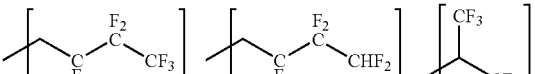
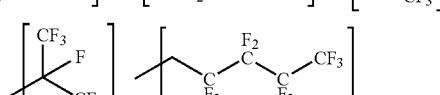
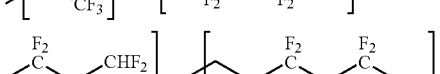
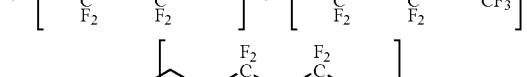
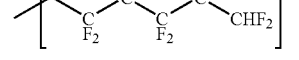

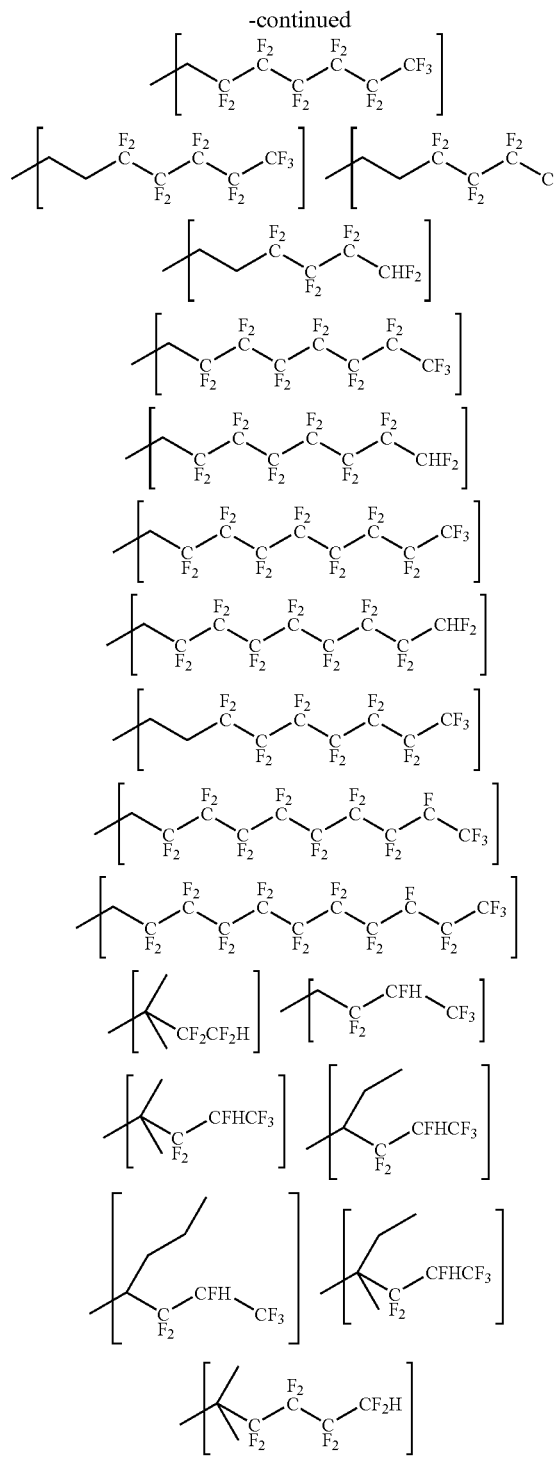

As mentioned above, "a" and "b" are numbers in the range: 0<a<1, 0<b<1, and 0<a+b≦1. In these embodiments, the polymers may optionally contain other repeat units, specifically repeat units d, e, f, h and i as will be described later. These subscripts are numbers in the range: 0≦d≦1, 0≦e≦0.9, 0≦f≦0.9, 0≦h≦0.9, and 0≦i≦0.9; and in a preferred embodiment, 0.1≦a≦0.9, 0.1≦b≦0.9, 0.2≦a+b≦1.0, 0≦d≦0.8, 0≦e≦0.6, 0≦f≦0.8, 0≦h≦0.8, 0≦i≦0.8, and a+b+d+e+f+h+i=1. The meaning of a+b+d+e+f+h+i=1 is that in a polymer comprising repeat units a, b, d, e, f, h and i, the total of these repeat units is 100 mol % based on the total amount of entire repeat units.

The invention addresses the immersion lithography process for forming a pattern by forming a photoresist layer on a wafer, forming a protective coating on the photoresist layer from a resist overlay material, exposing the layer structure in water to light, and developing. The resist protective coating material of the invention is best suited as the resist overlay material and characterized by comprising a polymer having a partial structure of the general formula (2).

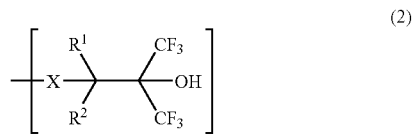

(2)

Herein $R^1$ and $R^2$ each are a hydrogen atom or a straight, branched or cyclic $C_1$-$C_{12}$ alkyl group, or $R^1$ and $R^2$ may bond together to form a ring, preferably of 3 to 20 carbon atoms, more preferably 3 to 10 carbon atoms, with the carbon atom to which they are attached. X is —O— or —C(=O)—O—.

In the polymer having a partial structure of formula (2), repeat units having the general formula (3) are preferably incorporated.

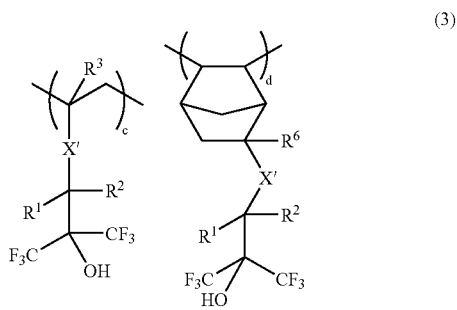

(3)

Herein $R^1$ and $R^2$ are as defined above. $R^3$ and $R^6$ each are a hydrogen atom, fluorine atom, methyl group or trifluoromethyl group. X' is —O—, —C(=O)—O— or —C(=O)—O—$R^7$—C(=O)—O—, wherein $R^7$ is a straight, branched or cyclic $C_1$-$C_{10}$ alkyl group. The subscripts "c" and "d" are numbers in the range: 0≦c≦1, 0≦d≦1, and 0<c+d≦1.

The preferred polymer having a partial structure of formula (2) is a polymer comprising repeat units having formula (3). Using a polymer having repeat units of formula (3), a resist protective coating can be formed having a dissolution rate of up to 0.1 angstrom per second (Å/s) in water and a dissolution rate of at least 300 Å/s in a developer which is a 2.38 wt % aqueous solution of tetramethylammonium hydroxide (TMAH). The alkali dissolution rate is preferably greater than or equal to 1,000 Å/s and more preferably greater than or equal to 2,000 Å/s. If the alkali dissolution rate is too low, there is a likelihood that undissolved matter forms in a mixing layer with the resist to cause bridge-like defects, and the resist surface after development becomes hydrophobic to cause blob defects. Blob defects form during drying of droplets when the hydrophobic resist surface is spin dried after rinsing. Specifically, the hydrophobic surface has a large contact angle with water; as water droplets become smaller during drying, the contact angle becomes smaller and the internal energy of water droplets increases; water droplets dry up while scraping the film surface or causing additives like acid generators to agglomerate. These result in blob defects.

Hexafluoroalcohol groups are acidic due to the high electronegativity of fluorine atoms and thus dissolvable in alkaline aqueous solution. However, their solubility in alkaline aqueous solution is so low that two or more hexafluoroalcohol groups must be incorporated in order to provide a sufficient alkali solubility. The hexafluoroalcohol group as used herein has a higher acidity than hexafluoroalcohol groups of the prior art type because it has an ester moiety bonded at the beta-position relative to the alcohol moiety, the ester moiety exerting an additional electron-withdrawing effect. Then even one hexafluoroalcohol group can provide for a sufficient alkali solubility. The invention is predicated on this finding.

Examples of suitable monomers from which the repeat units "c" in formula (3) are derived are given below.

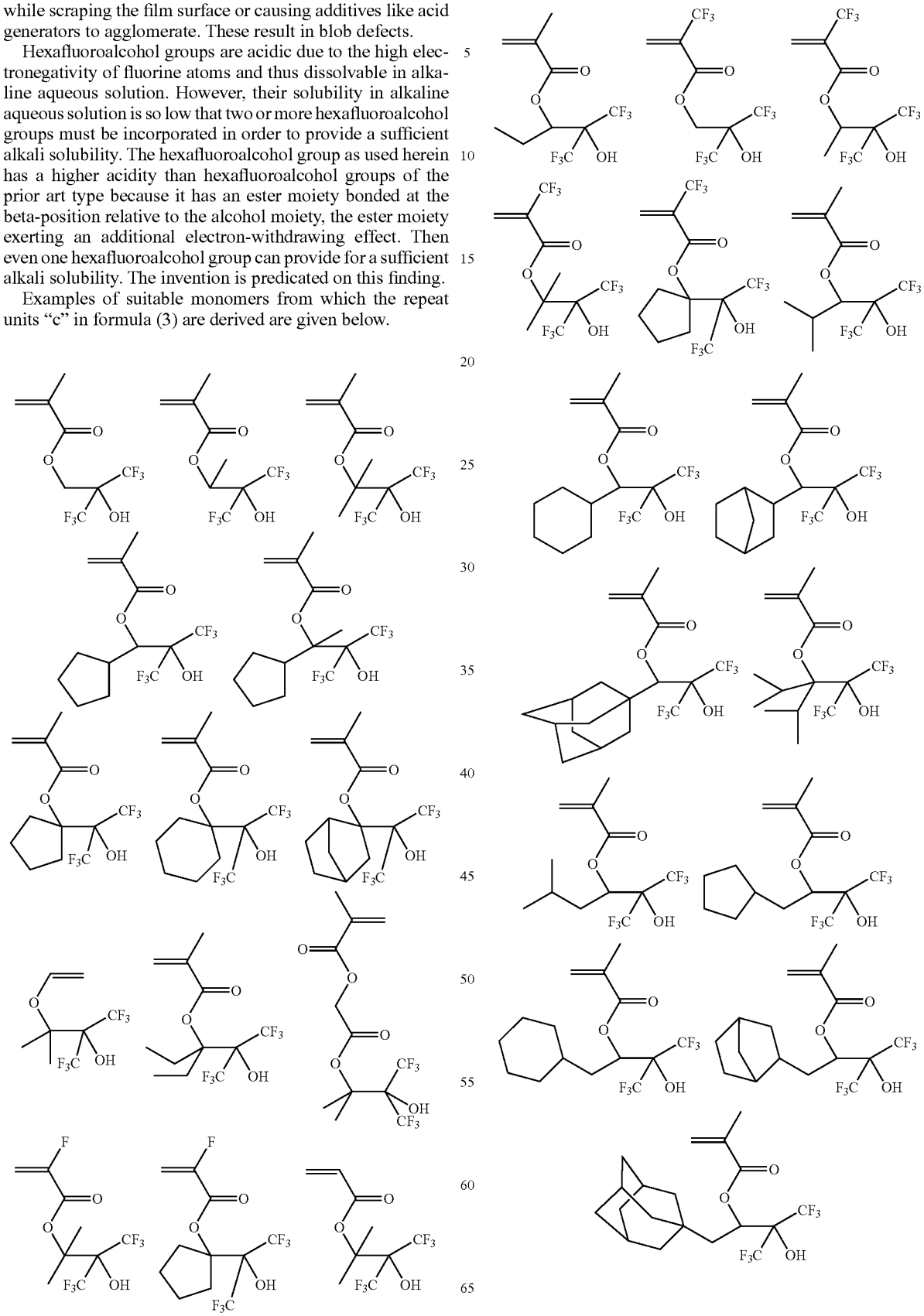

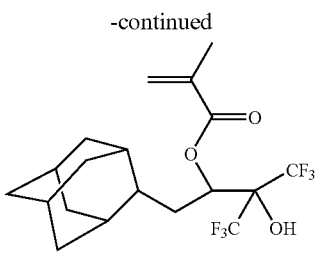
Examples of suitable monomers from which the repeat units "d" in formula (3) are derived are given below.
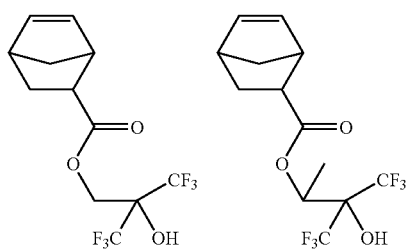
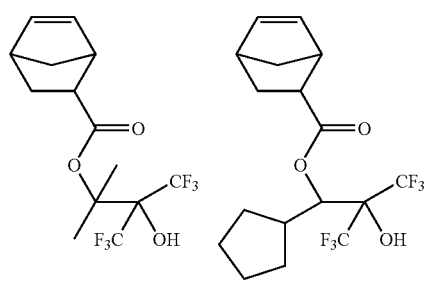
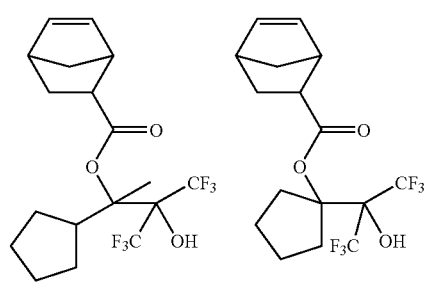
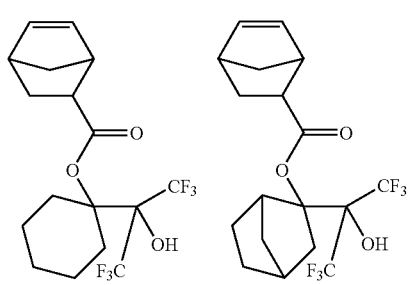
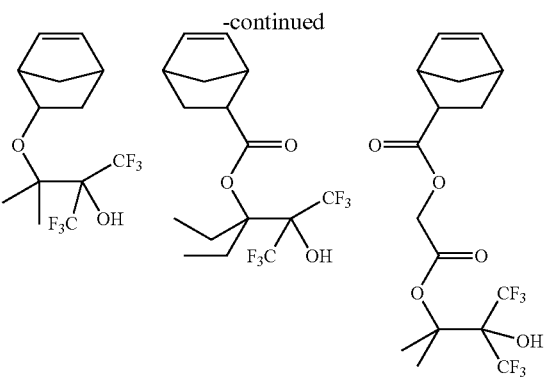
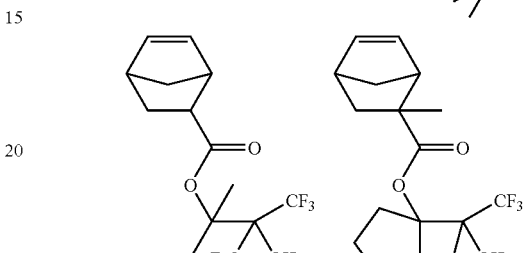
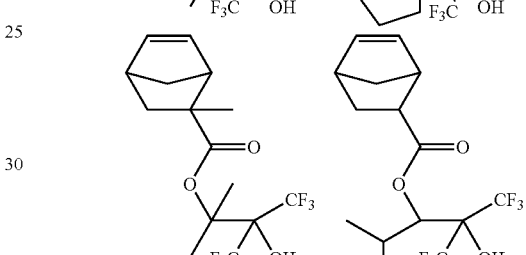
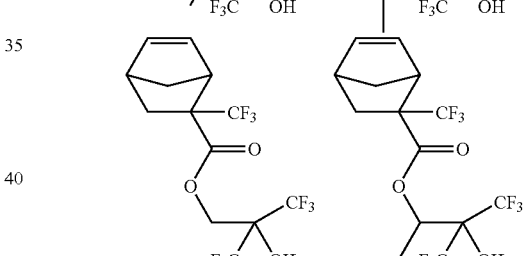
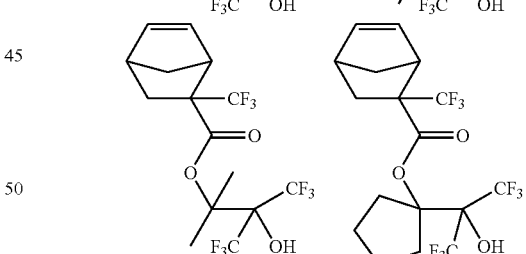
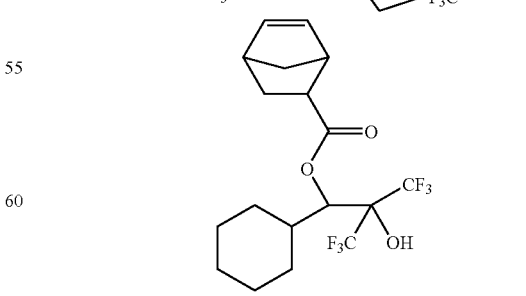
Units "c" and/or "d" represented by formula (3) are essential as the repeat units of which the polymer for use as the resist protective coating according to the invention is composed. For alkali solubility and for preventing intermixing with the resist film, the polymer may have further copolymerized therein repeat units "e" having carboxyl groups. Illustrative examples of repeat units "e" are given below.
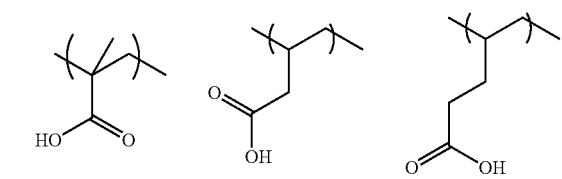
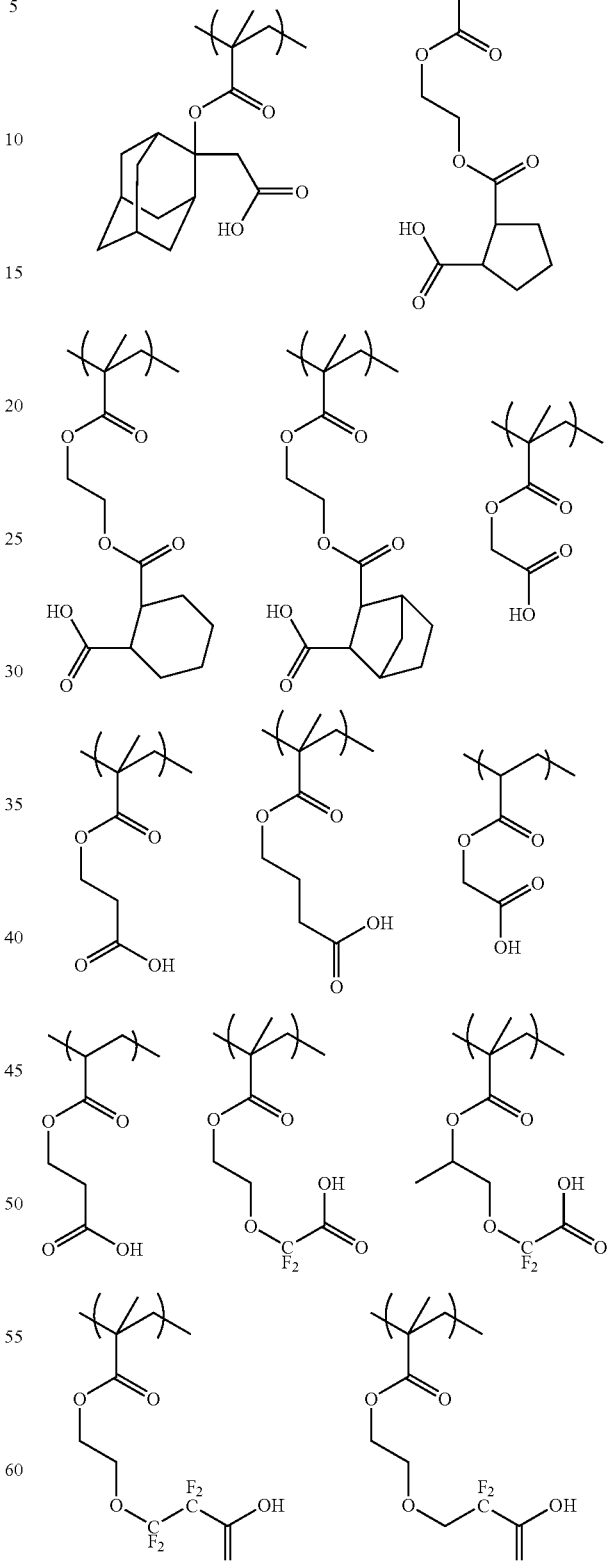

-continued
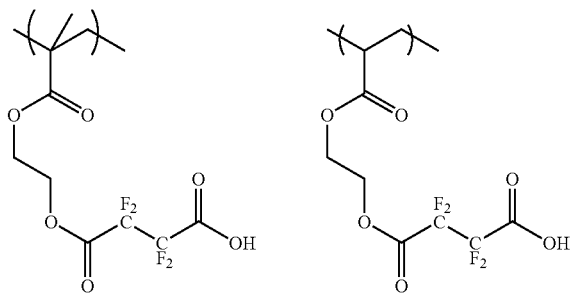
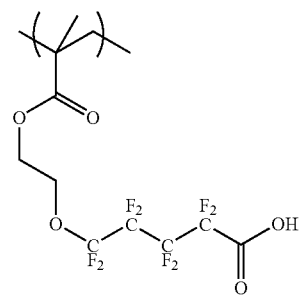
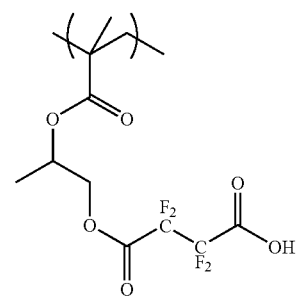
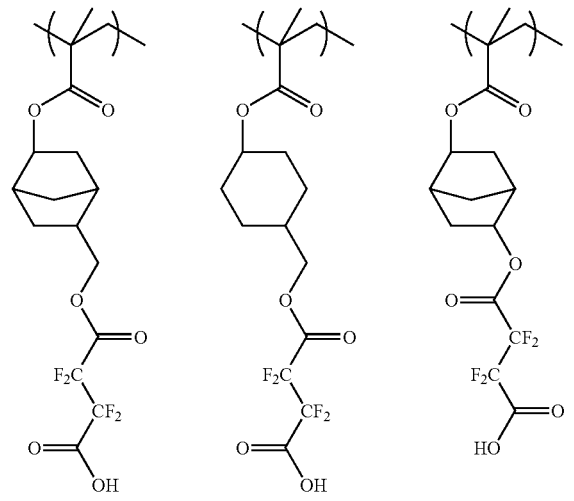
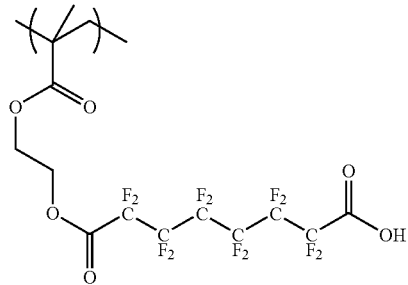
-continued
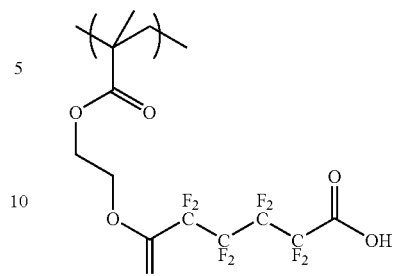
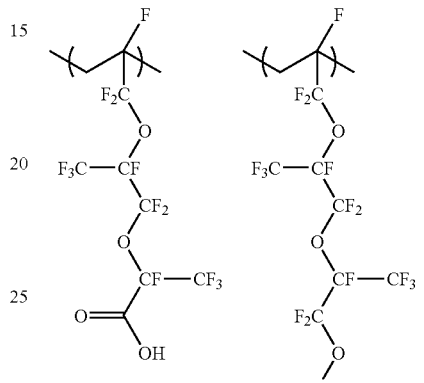
Also, the polymer may have further copolymerized therein repeat units "f" having fluoroalcohol other than formula (3). Illustrative examples of repeat units "f" are given below.
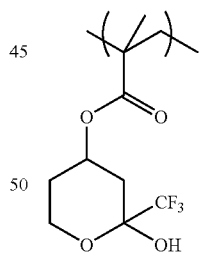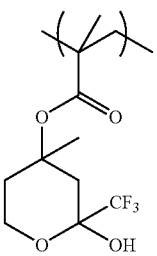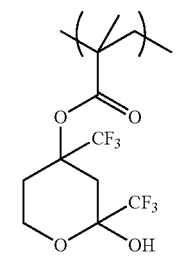
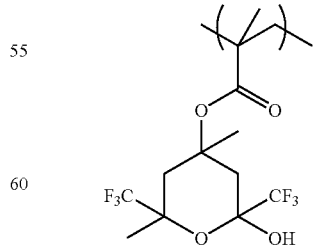

-continued
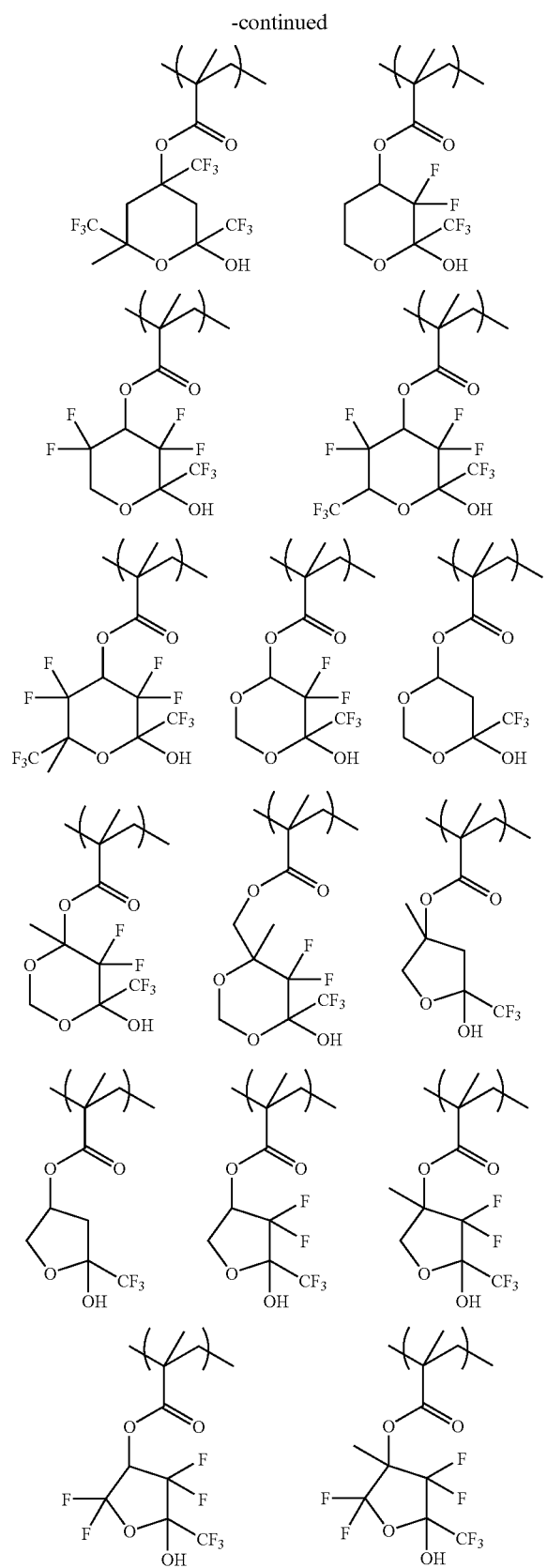
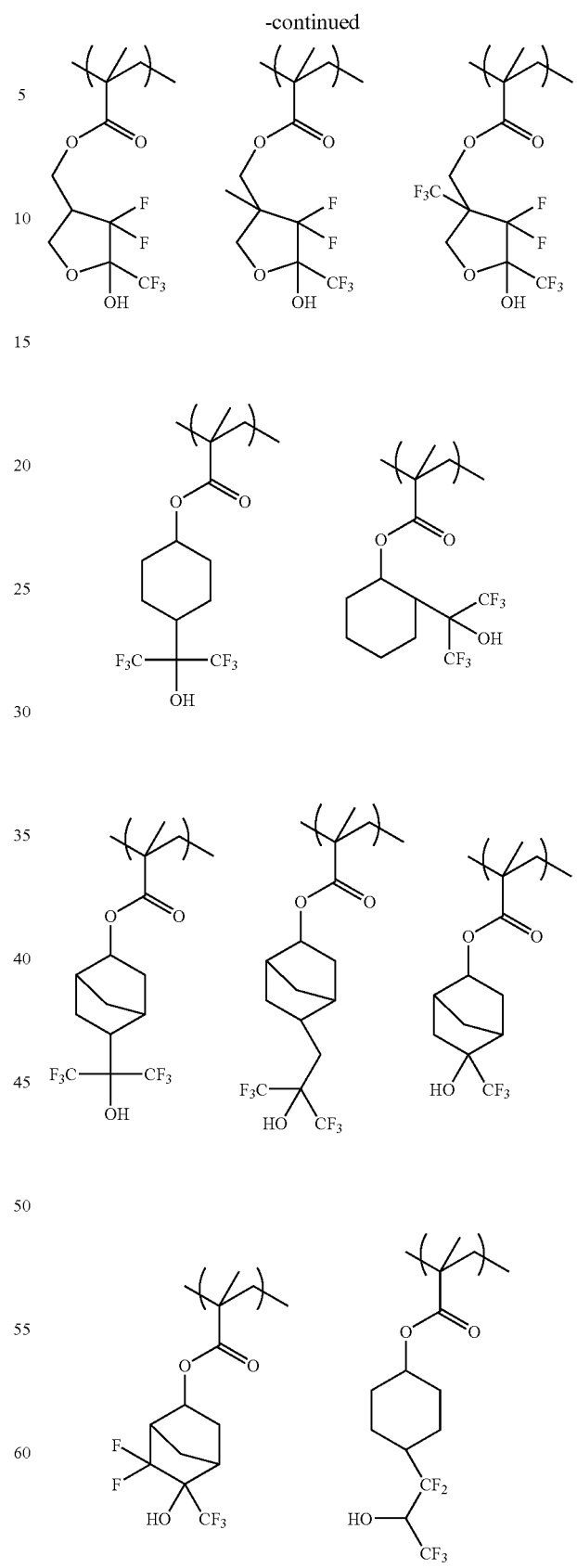

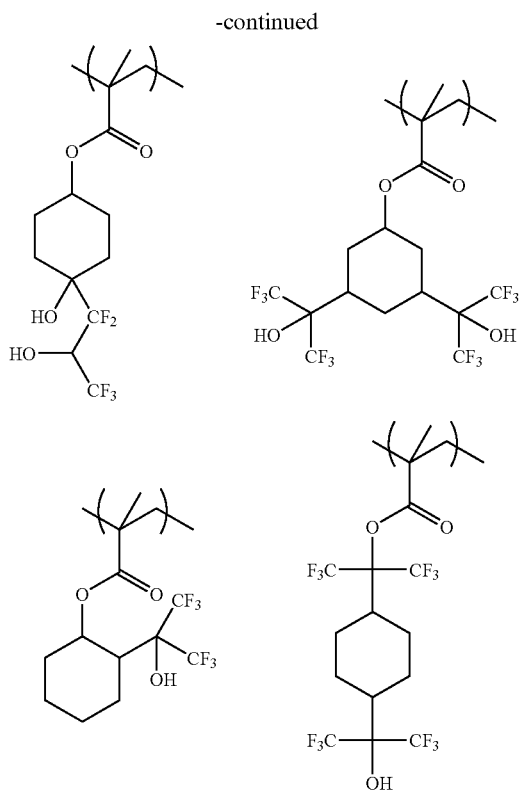
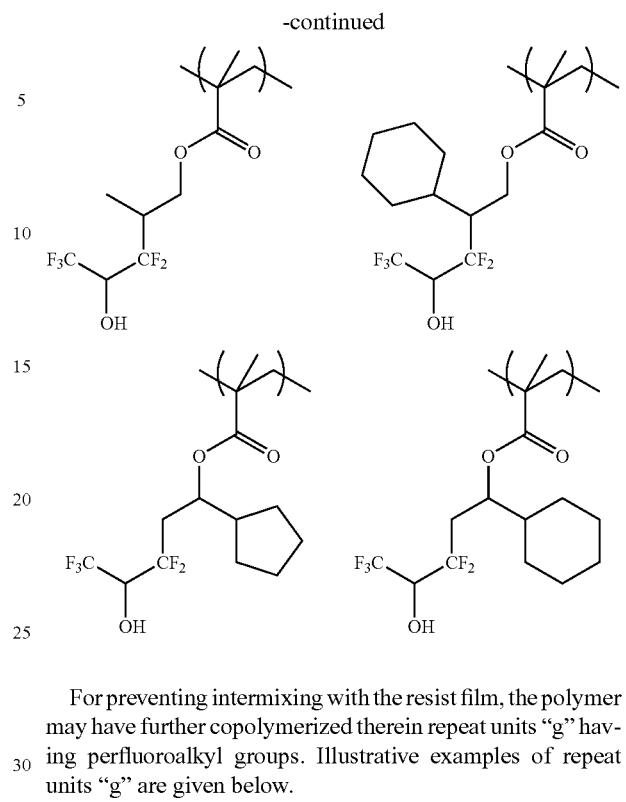
For preventing intermixing with the resist film, the polymer may have further copolymerized therein repeat units "g" having perfluoroalkyl groups. Illustrative examples of repeat units "g" are given below.
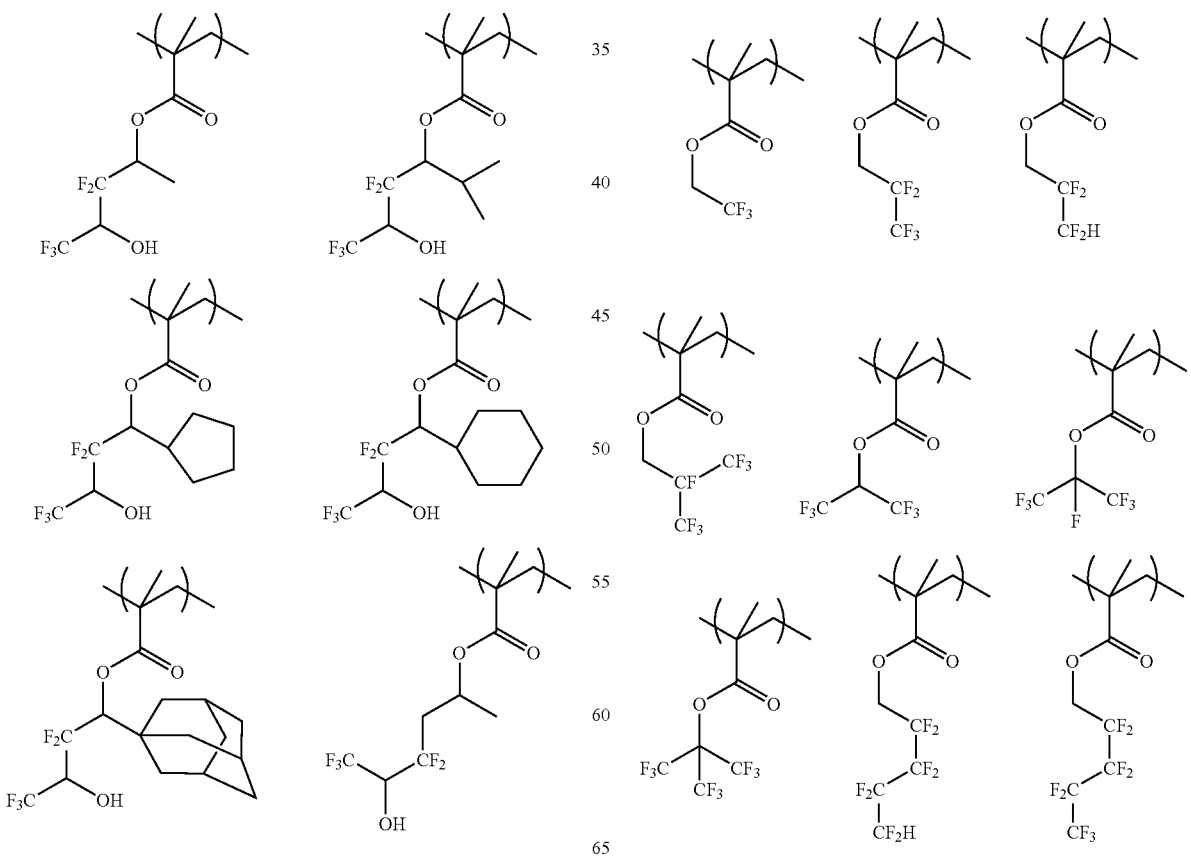

-continued
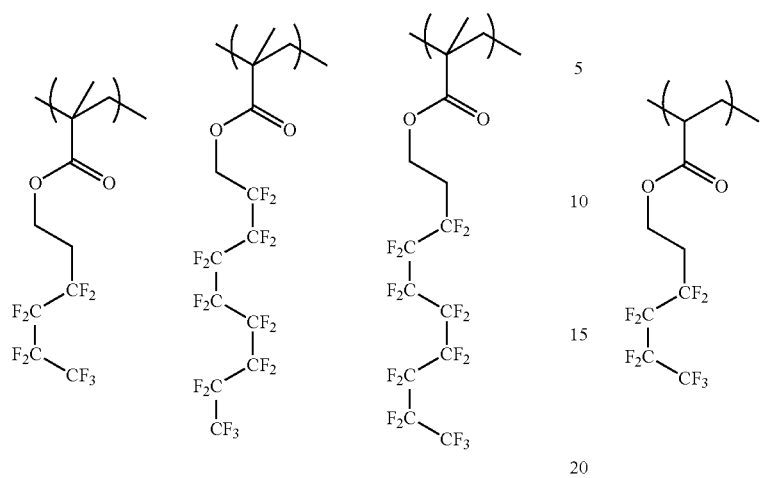
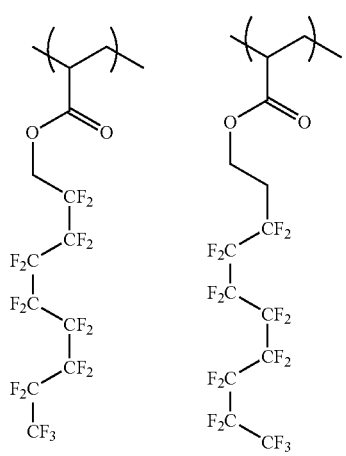
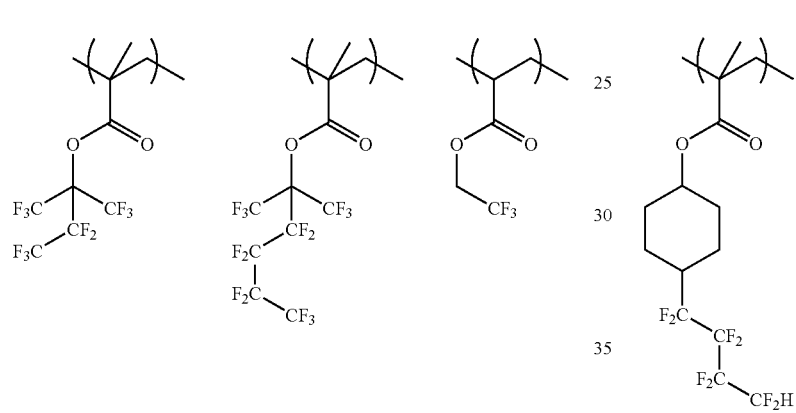
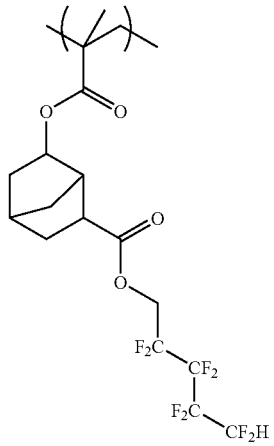
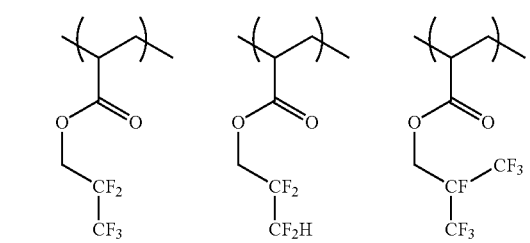
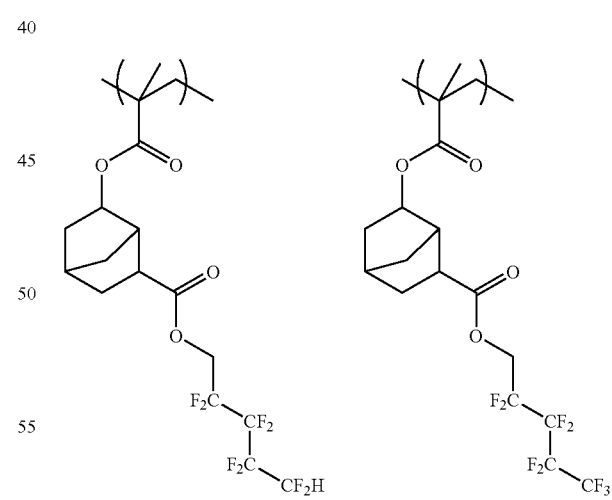
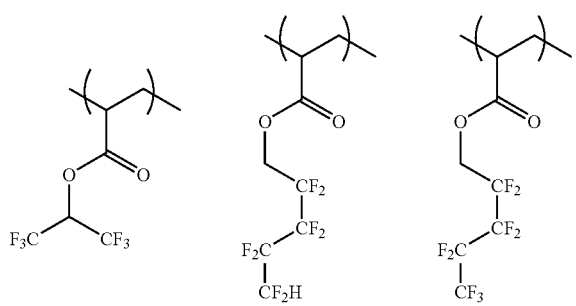

-continued
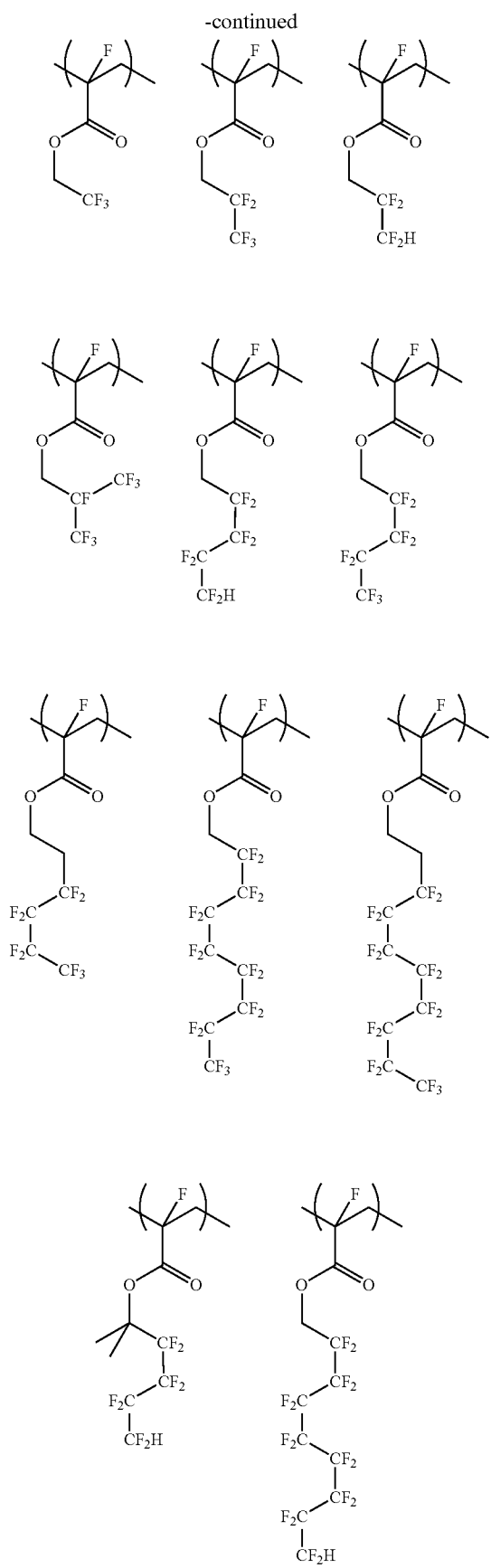
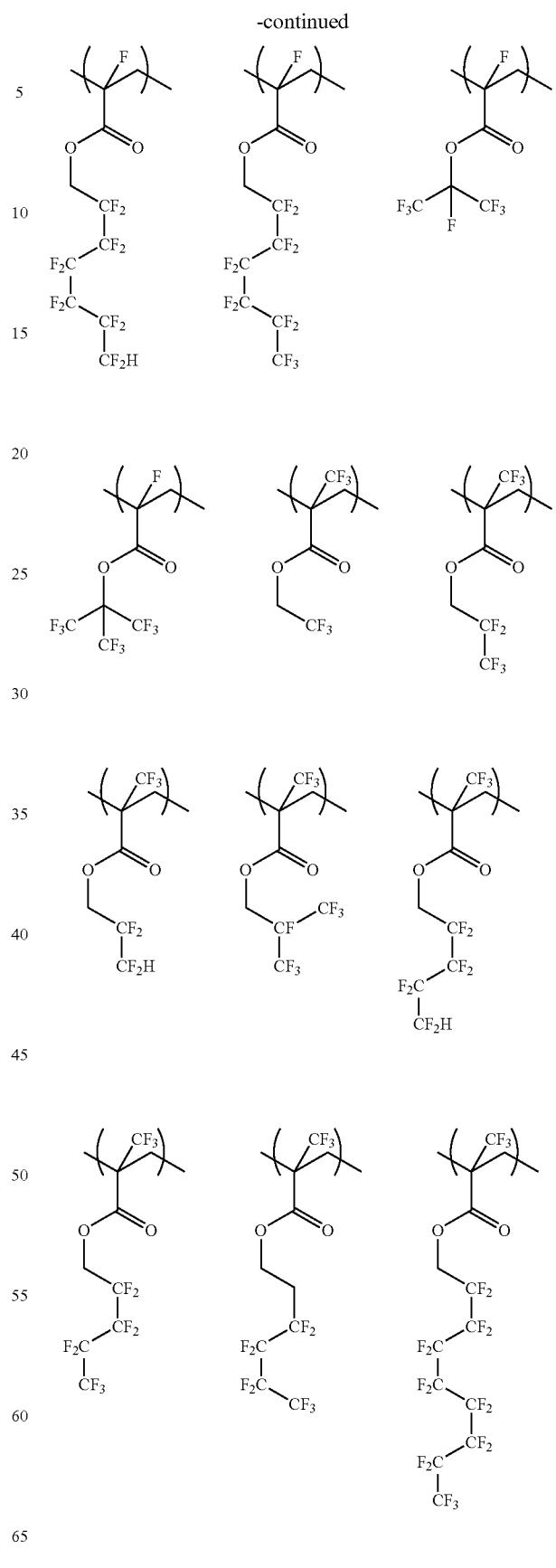

-continued
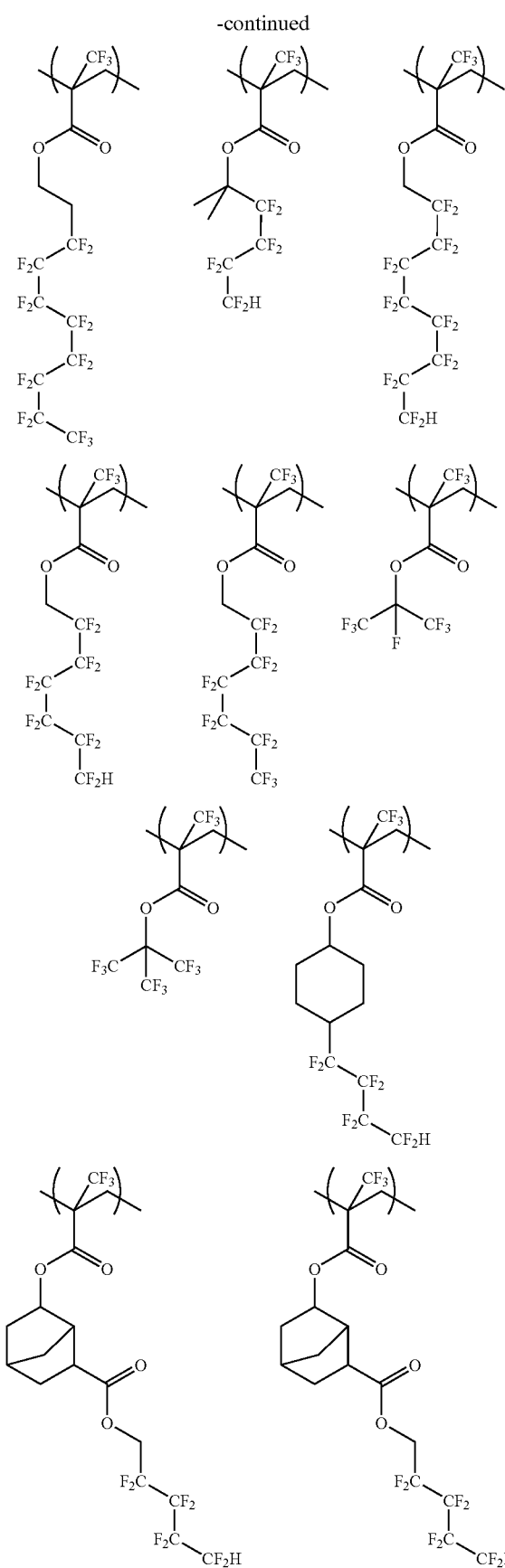
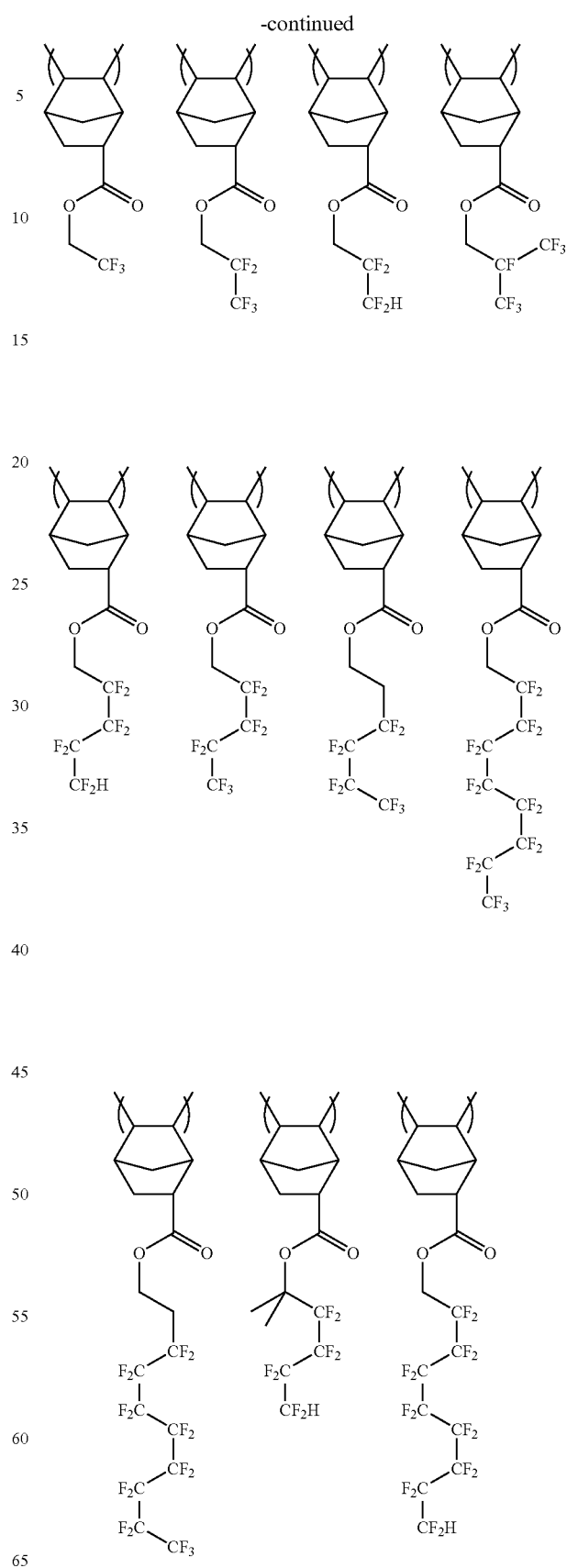

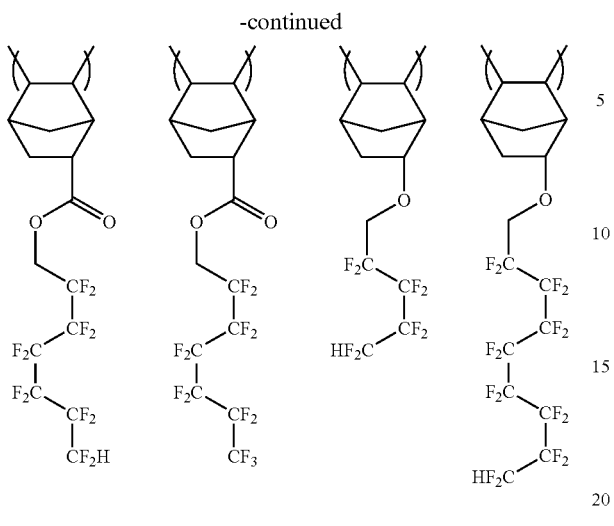
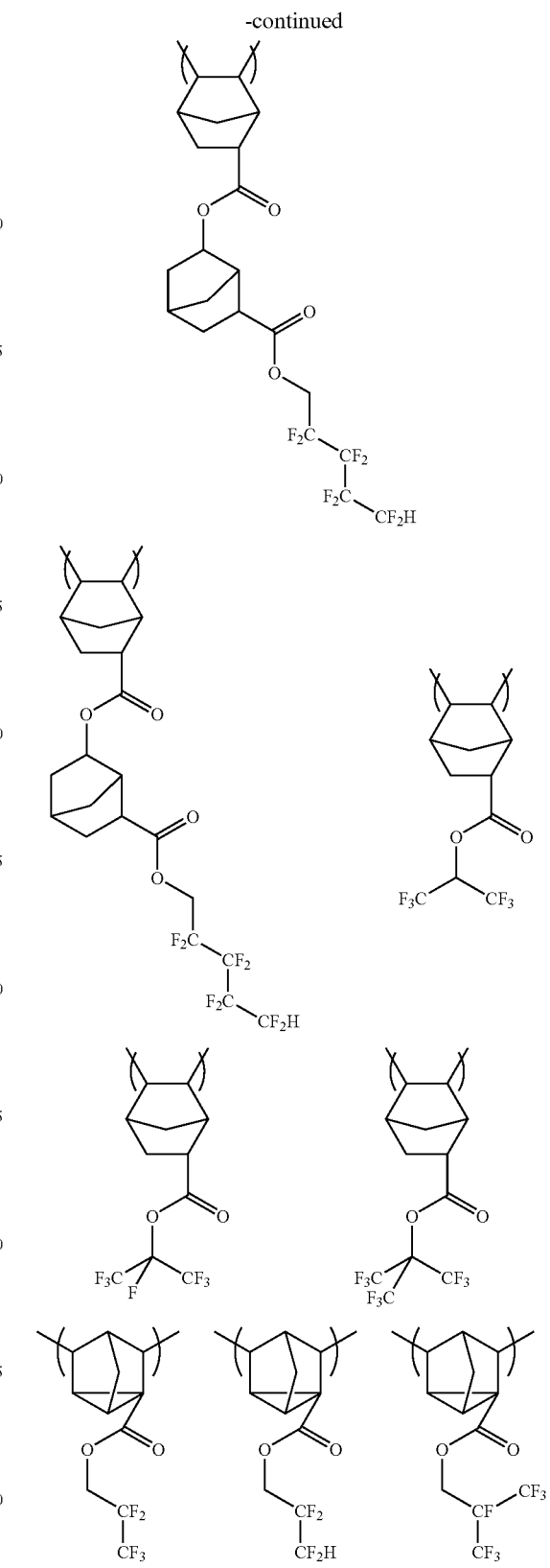

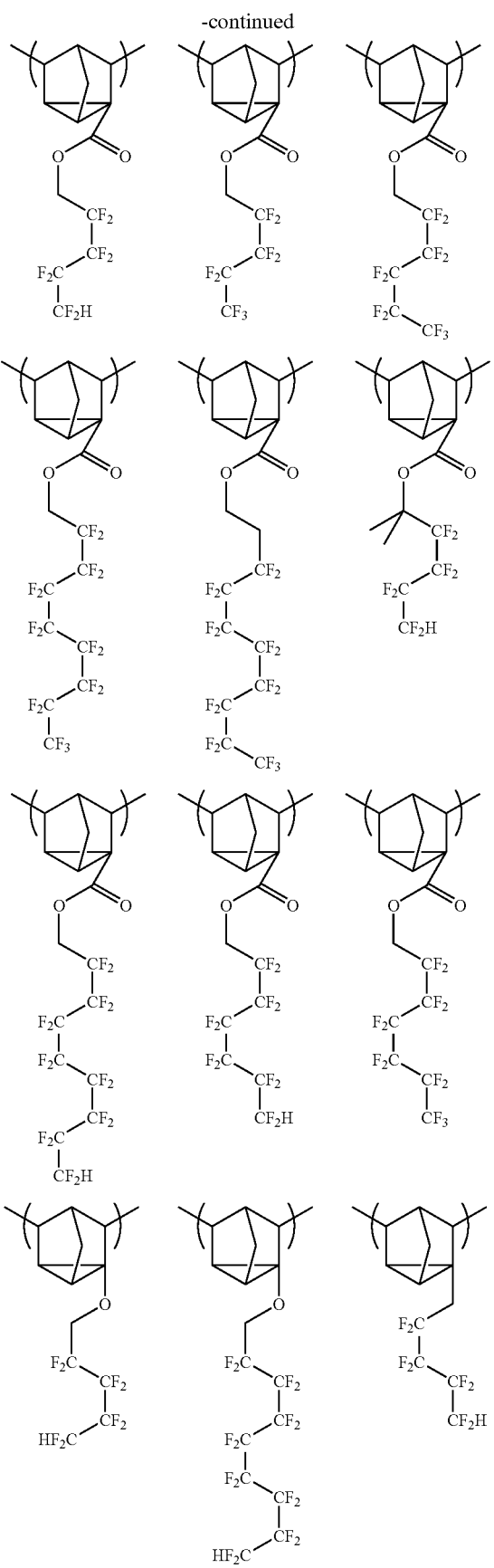
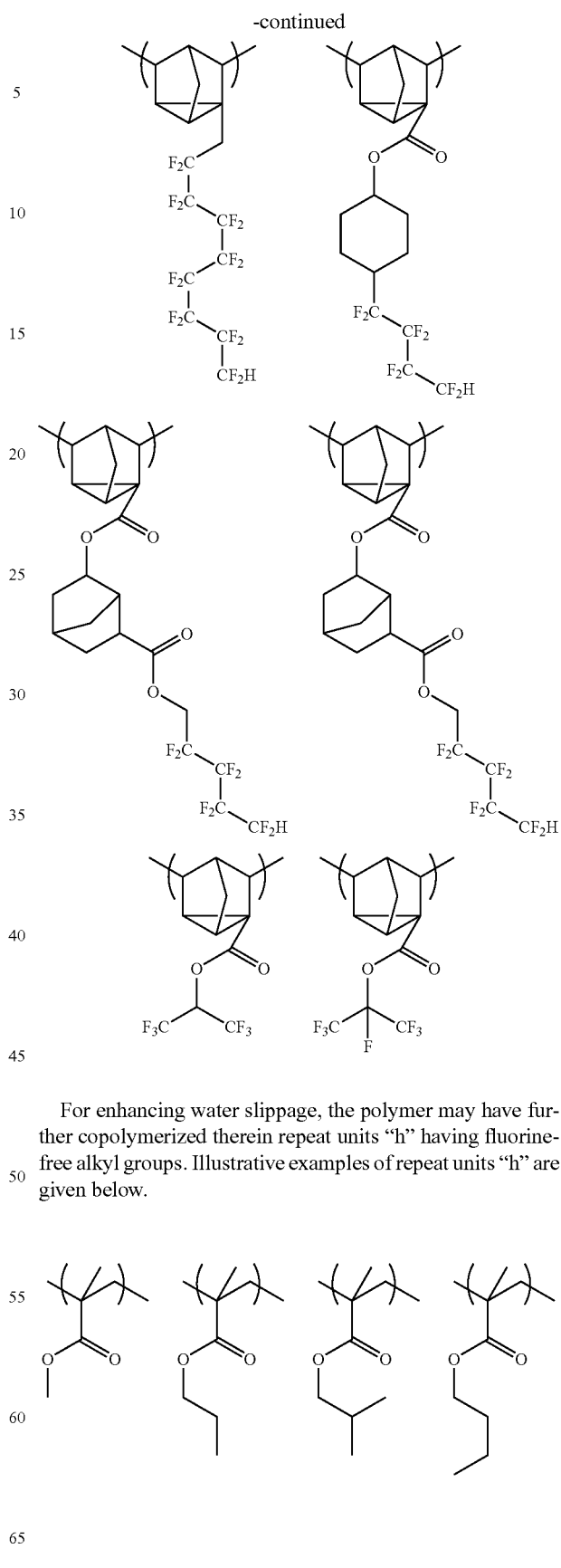
For enhancing water slippage, the polymer may have further copolymerized therein repeat units "h" having fluorine-free alkyl groups. Illustrative examples of repeat units "h" are given below.

-continued
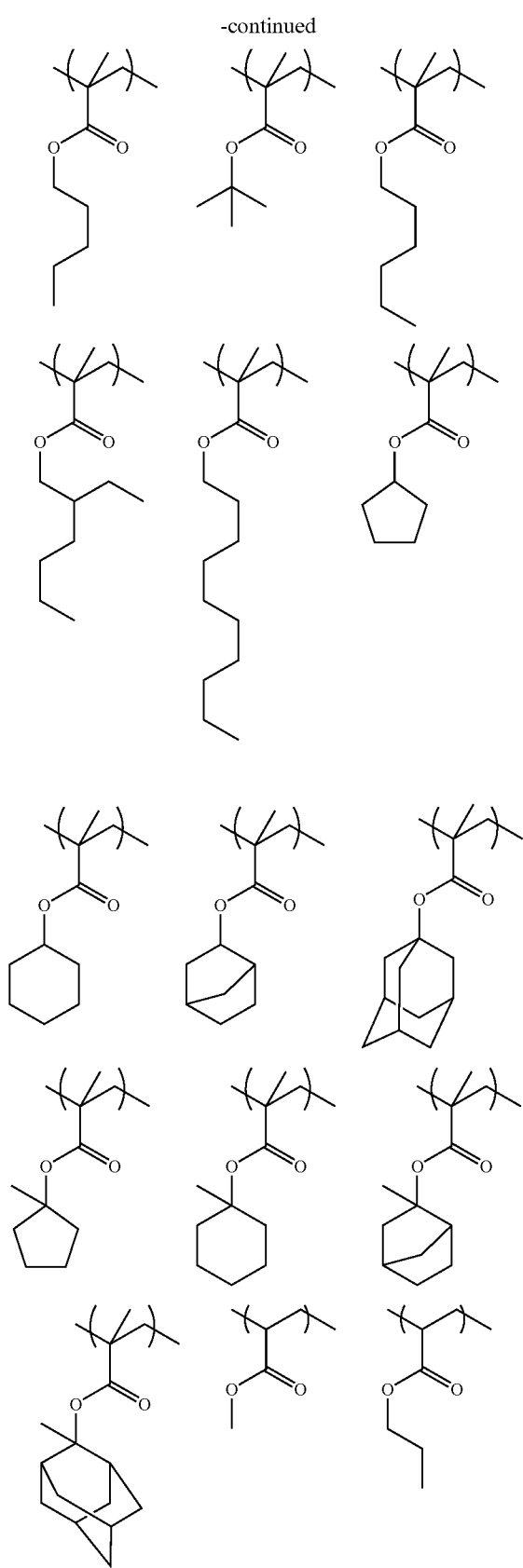
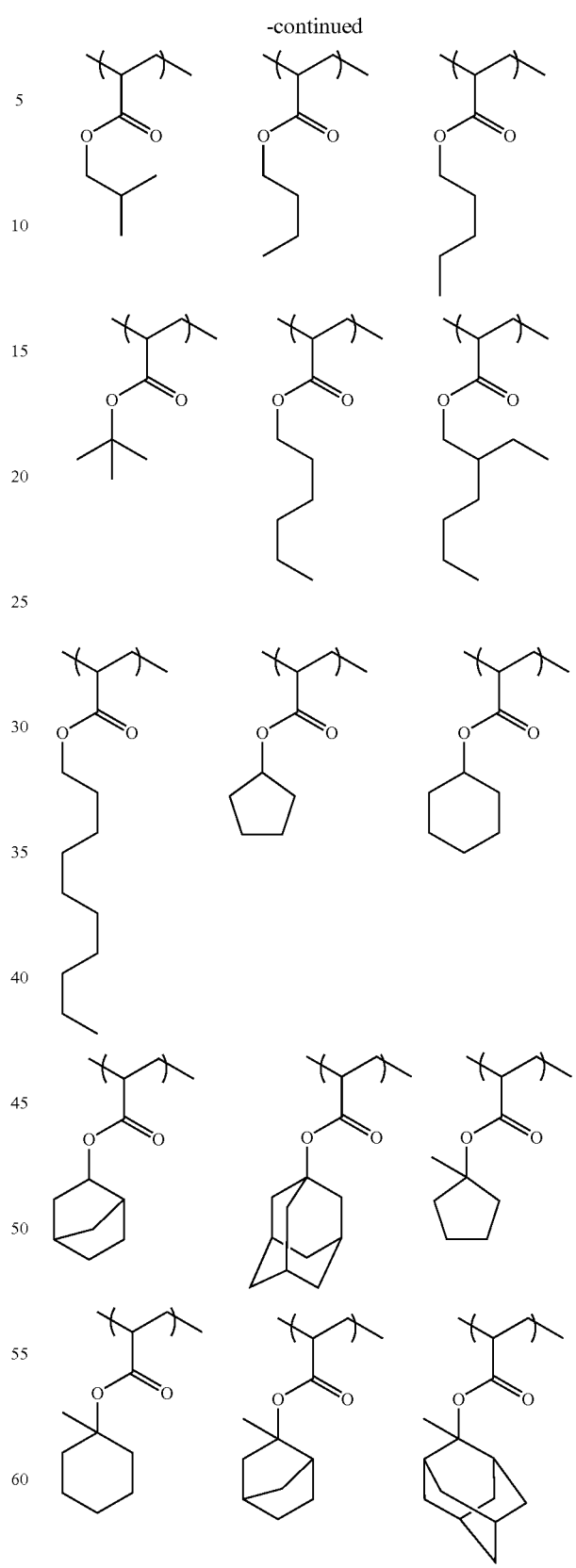

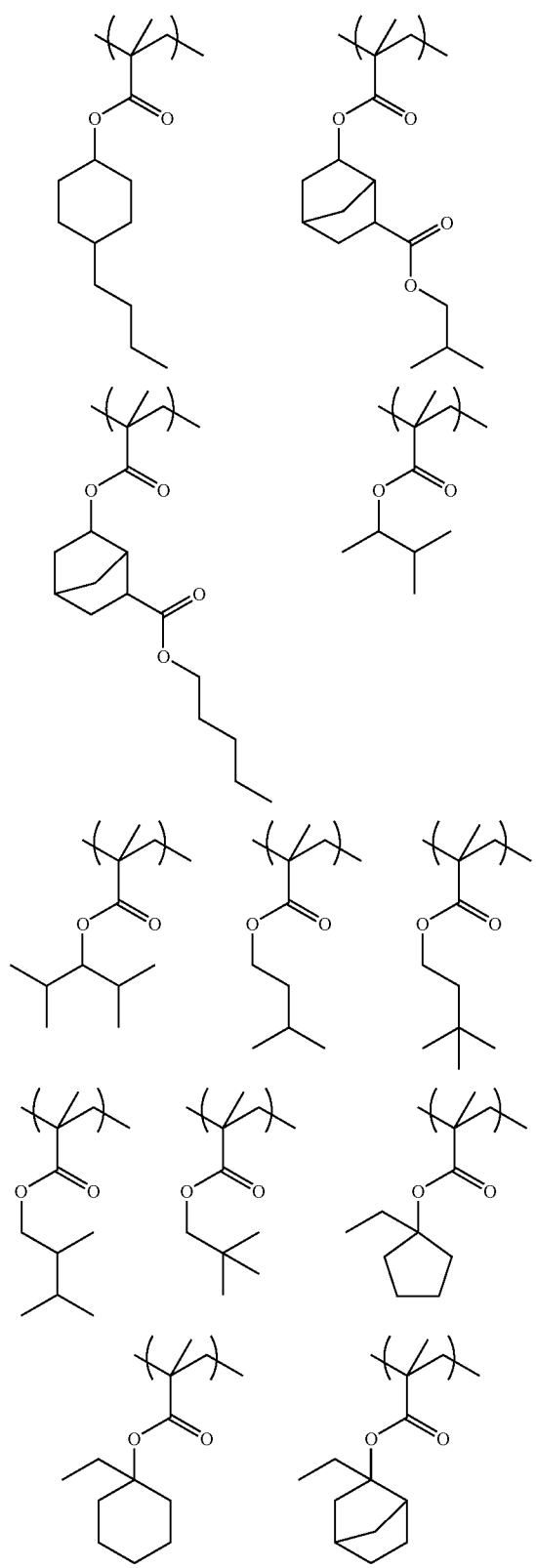
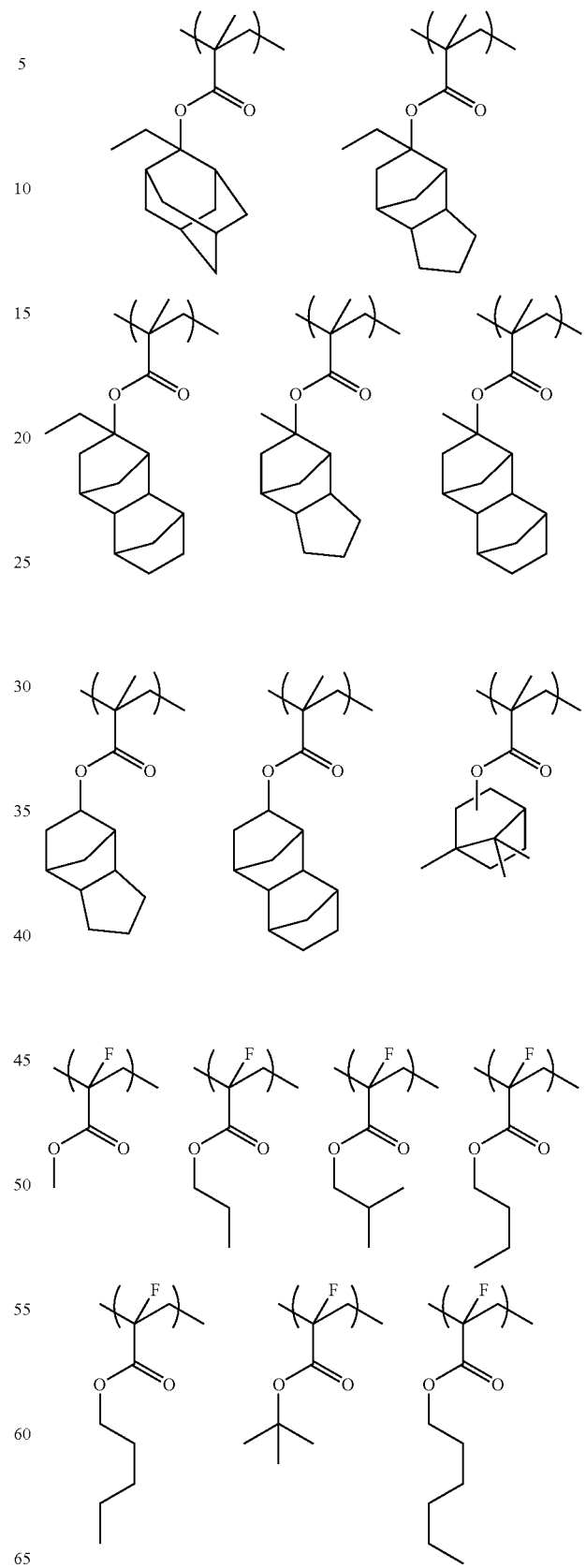

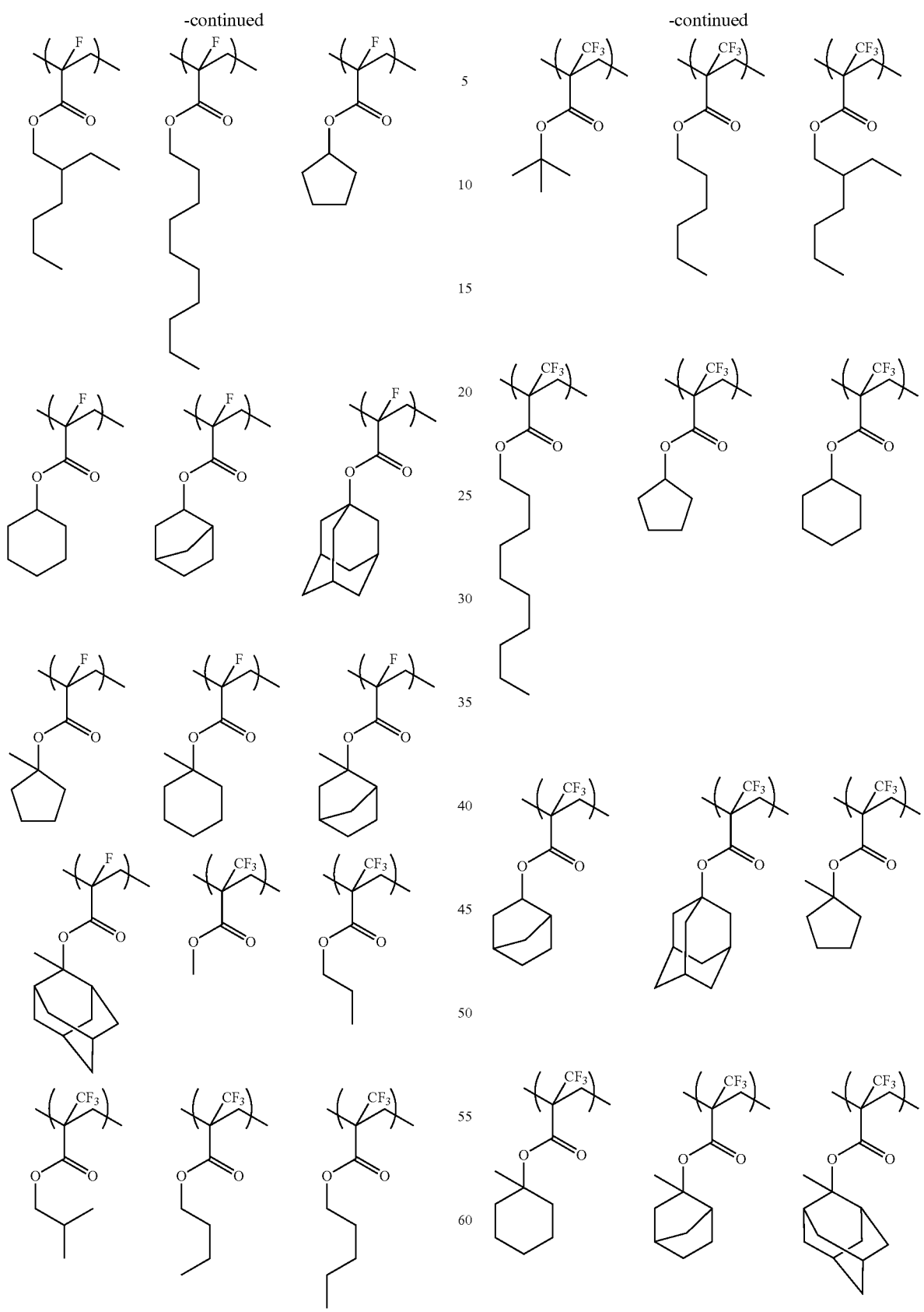

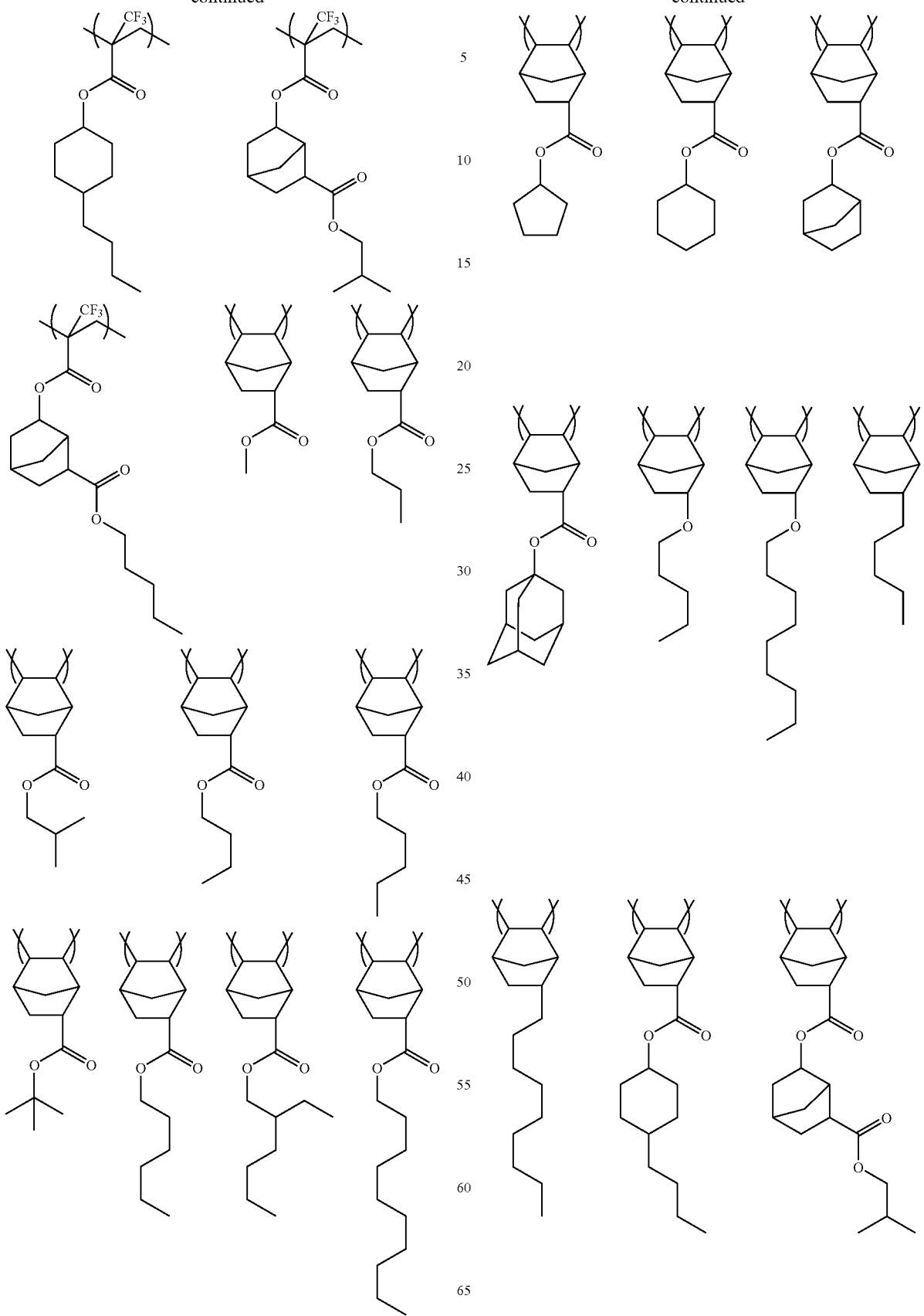

-continued
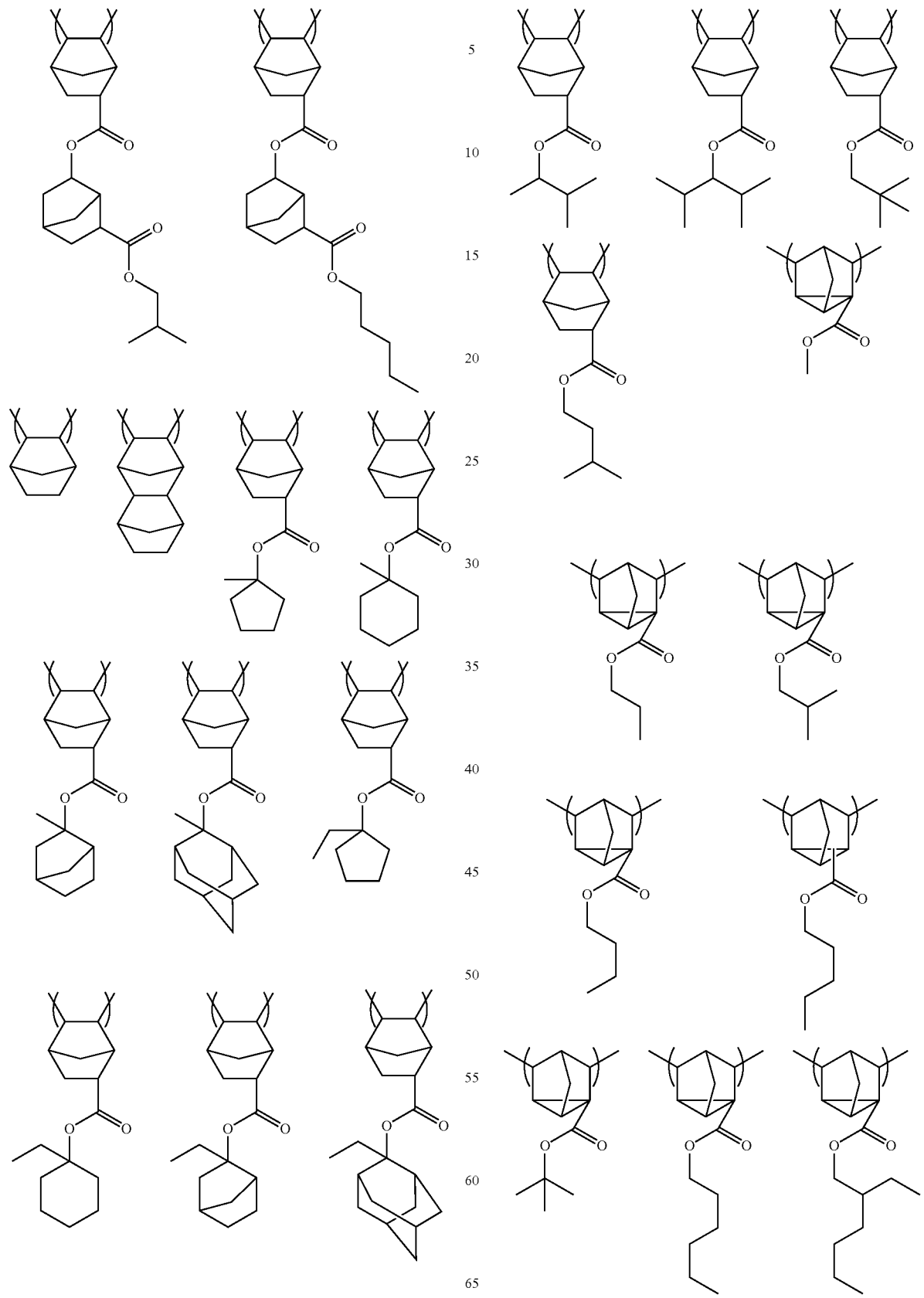

-continued
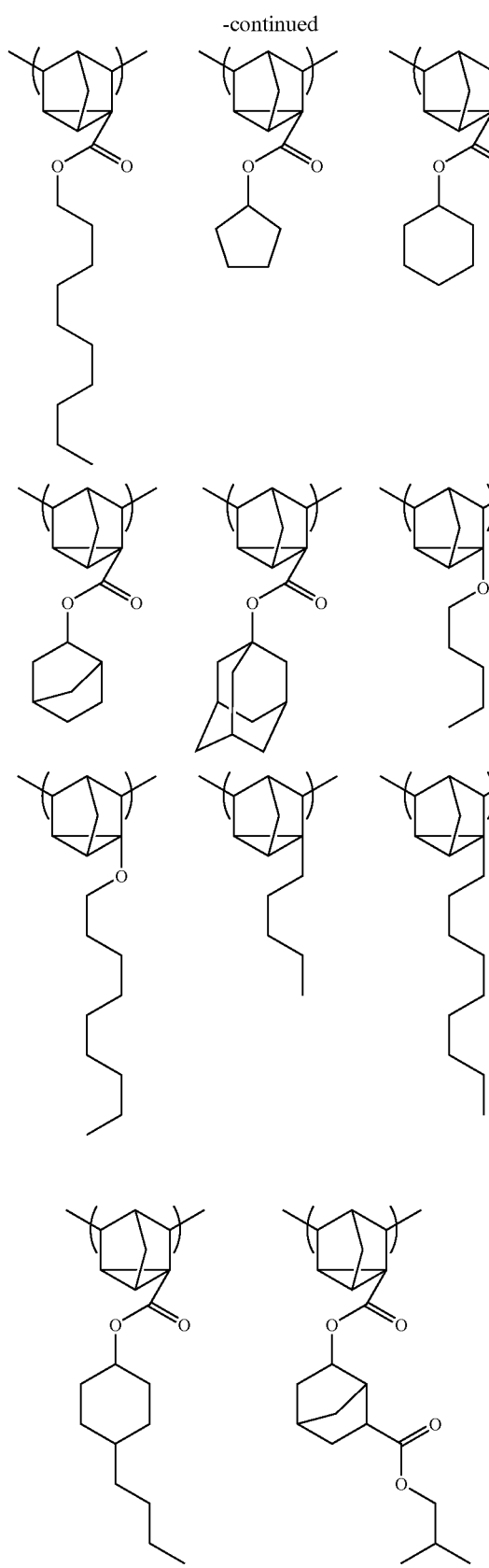
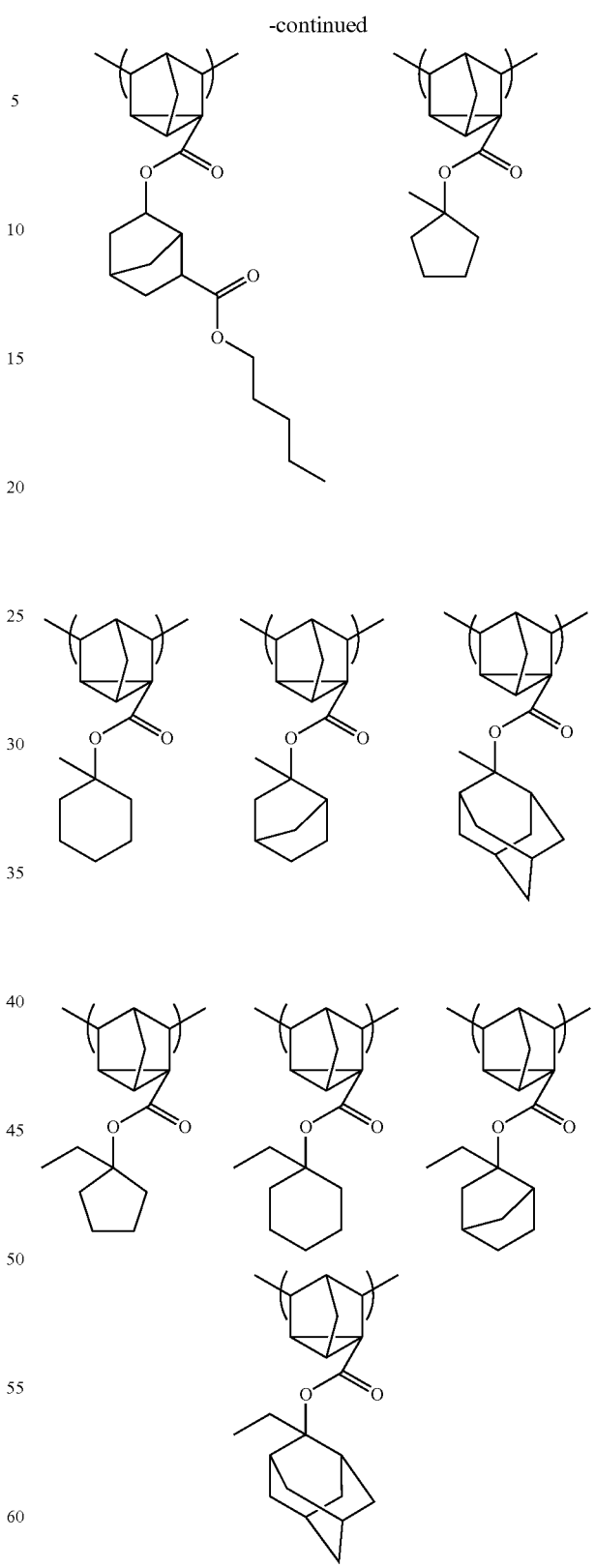
Still further, the polymer may have copolymerized therein repeat units "i" having both fluoroalkyl and alkyl groups, as shown below.

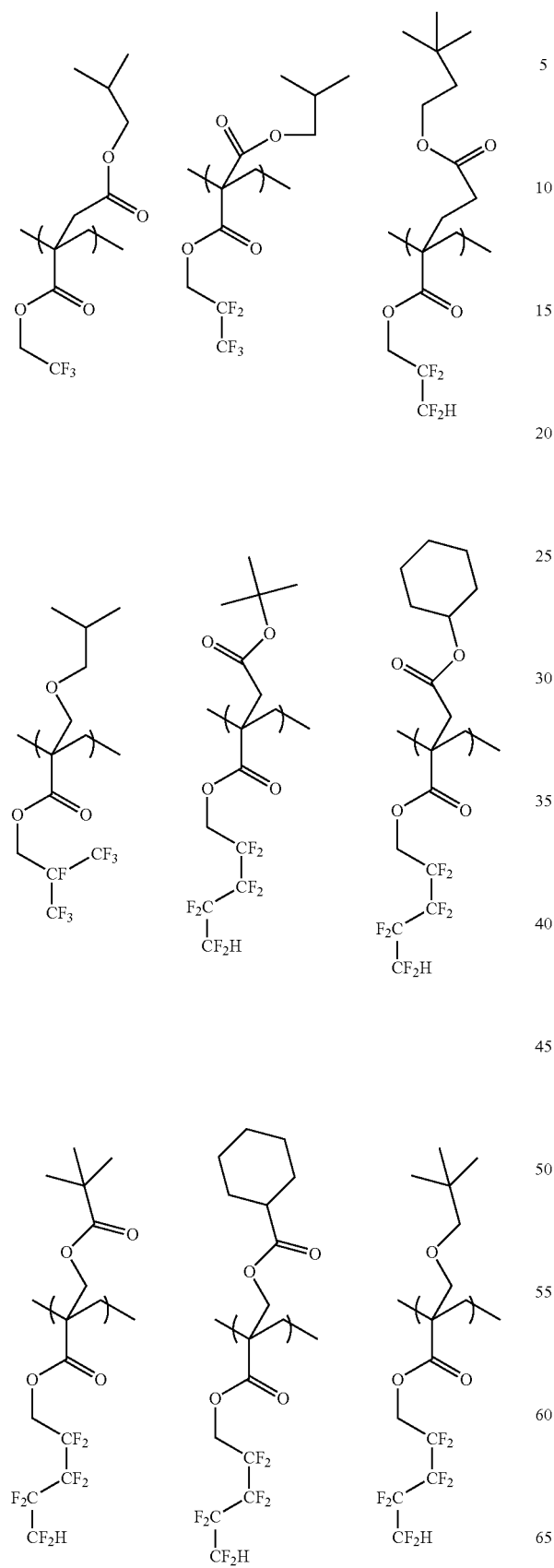

-continued
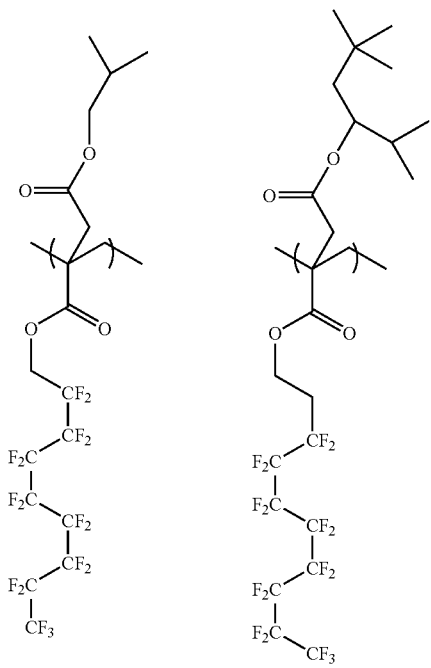
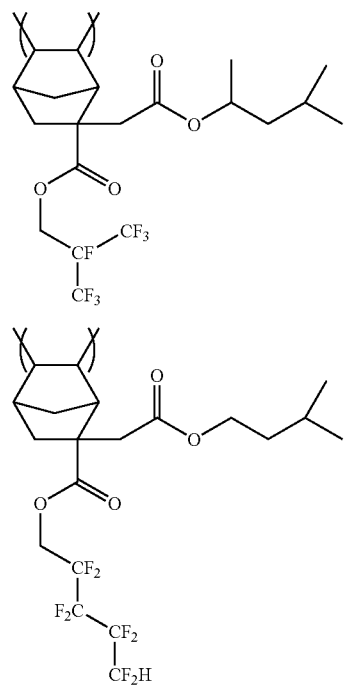
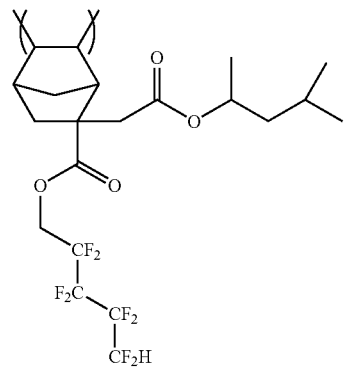

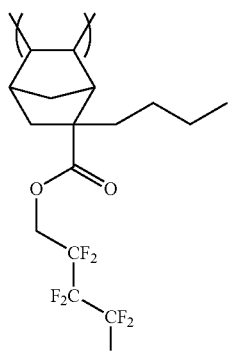
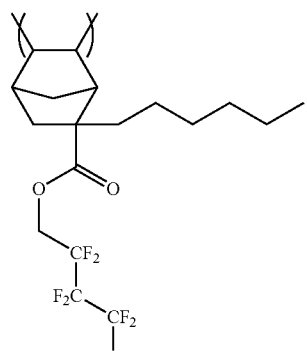
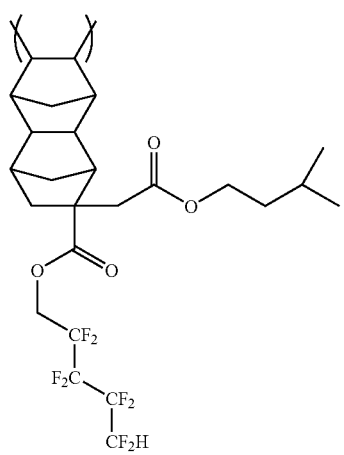
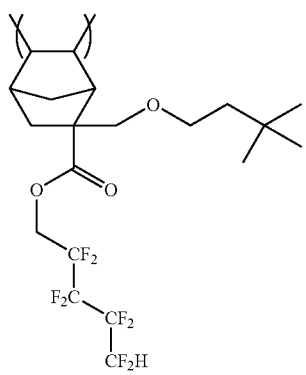
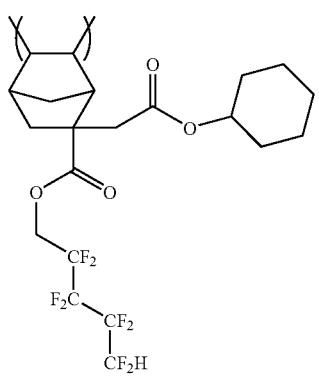
Still further, the polymer may have copolymerized therein repeat units "j" having hydroxyl groups, as shown below.
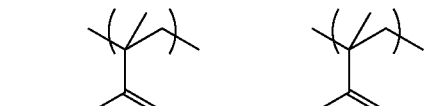
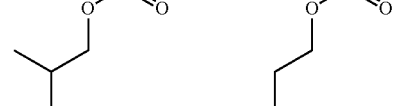
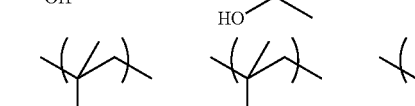
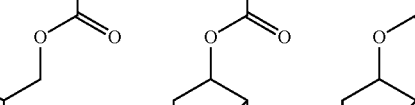

-continued

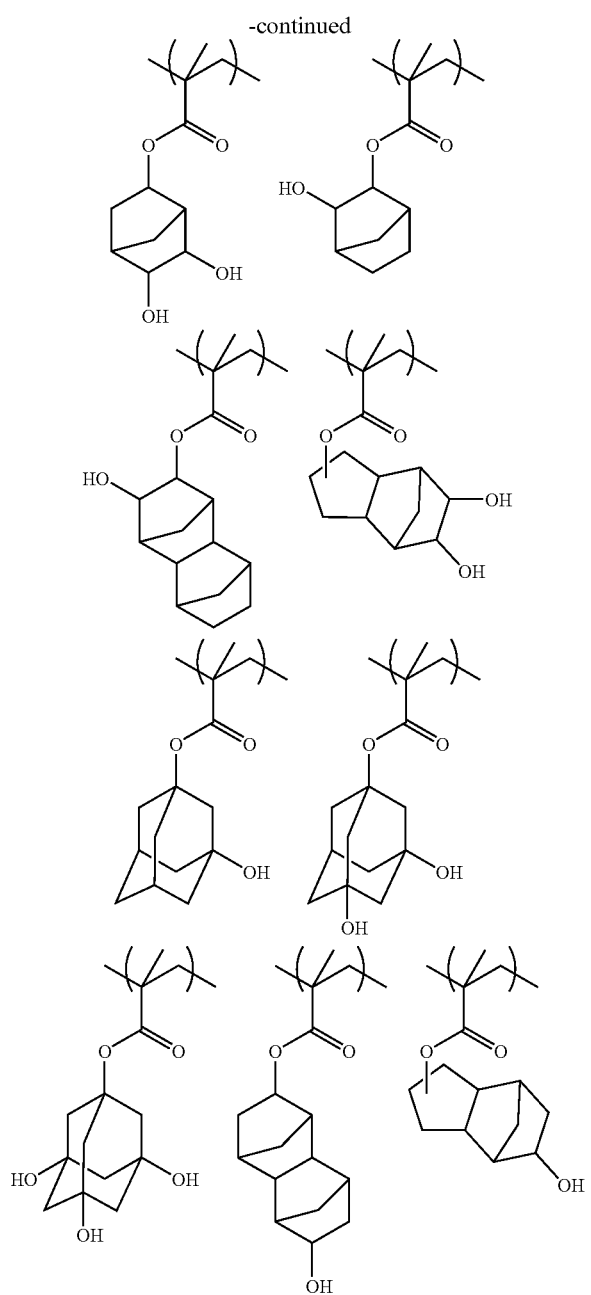

In the polymer, the foregoing repeat units are included in proportions c, d, e, f, g, h, i, and j in the range: $0 \leq c \leq 1.0$, $0 \leq d \leq 1.0$, $0 < c+d \leq 1.0$, $0 \leq e \leq 0.9$, $0 \leq f \leq 0.9$, $0 \leq g \leq 0.9$, $0 \leq h \leq 0.9$, $0 \leq i \leq 0.9$, and $0 \leq j \leq 0.9$; and preferably $0 \leq c \leq 0.8$, $0 \leq d \leq 0.8$, $0.1 \leq c+d \leq 0.8$, $0 \leq e \leq 0.6$, $0 \leq f \leq 0.8$, $0 \leq g \leq 0.8$, $0 \leq h \leq 0.8$, $0 \leq i \leq 0.8$, and $0 \leq j \leq 0.8$, and $c+d+e+f+g+h+i+j=1$. The meaning of $c+d+e+f+g+h+i+j=1$ is that in a polymer comprising repeat units c, d, e, f, g, h, i, and j, the total of these repeat units is 100 mol % based on the total amount of entire repeat units.

The polymers of the invention should preferably have a weight average molecular weight (Mw) of 1,000 to 500,000, more preferably 2,000 to 30,000, as determined by gel permeation chromatography (GPC) versus polystyrene standards. A polymer with too low a Mw may be miscible with the resist material or more dissolvable in water whereas too high a Mw may interfere with film formation after spin coating and lead to a decline of alkali solubility.

The polymers may be synthesized by any desired method, for example, by dissolving unsaturated bond-containing monomers corresponding to the selected repeat units in an organic solvent, adding a radical initiator thereto, and effecting heat polymerization. Examples of the organic solvent which can be used for polymerization include toluene, benzene, tetrahydrofuran, diethyl ether, dioxane, methanol, ethanol and isopropanol. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is about 2 to 100 hours, preferably about 5 to 20 hours. It is acceptable that fluoroalcohol groups are in the form of acetyl or acetal in the monomeric stage and after polymerization, alkali or acid treatment is conducted to form fluoroalcohol.

In the practice of the invention, the polymer is dissolved in a suitable solvent to form a solution which is ready for use as the resist protective coating material. For film formation by spin coating technique, the solvent is preferably used in such amounts to provide a polymer concentration of 0.1 to 20% by weight, more preferably 0.5 to 10% by weight.

The solvent used herein is not particularly limited although those solvents in which resist layers can be dissolved should be avoided. It is recommended to avoid the use of conventional resist solvents, for example, ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate.

Suitable solvents in which resist layers are not dissolvable include nonpolar solvents, for example, higher alcohols of at least 4 carbon atoms, toluene, xylene, anisole, hexane, cyclohexane and ethers. Of these, ether compounds of 8 to 12 carbon atoms are most desirable. Suitable ether compounds include di-n-butyl ether, diisobutyl ether, di-sec-butyl ether, di-n-pentyl ether, diisopentyl ether, di-sec-pentyl ether, di-t-amyl ether, and di-n-hexyl ether. From the standpoint of flash point, ether compounds of 10 to 12 carbon atoms are preferred, with diisopentyl ether and di-n-pentyl ether being most preferred. Higher alcohols of at least 4 carbon atoms are also desirable. Examples of suitable alcohols include, but are not limited to, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol.

Fluorinated solvents are also preferred because resist layers are not dissolvable therein. Examples include, but are not limited to, 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoroacetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluorobutyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, S-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro(2,5-dimethyl-3,6-dioxane anionic) acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxaoctadecane, perfluorotributylamine, perfluorotrihexylamine, methyl perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol, 1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, 1,1,1-trifluoro-5,5-dimethyl-2,4-hexanedione, 1,1,1,3,3,3-hexafluoro-2-propanol, 1,1,1,3,3,3-hexafluoro-2-methyl-2-propanol, 2,2,3,4,4,4-hexafluoro-1-butanol, 2-trifluoromethyl-2-propanol, 2,2,3,3-tetrafluoro-1-propanol, 3,3,3-trifluoro-1-propanol, and 4,4,4-trifluoro-1-butanol, which may be used alone or in admixture.

Mixtures of at least two of the foregoing solvents are also acceptable. Mixtures of an ether compound of 8 to 12 carbon atoms and a higher alcohol of at least 4 carbon atoms, especially 4 to 10 carbon atoms are most preferred. The mixing proportion is preferably such that the higher alcohol is present in an amount of 0.1 to 90% by weight, more preferably 5 to 85% by weight, and even more preferably 7 to 80% by weight based on the weight of the solvent mixture.

Process

The lithography pattern forming process of the invention involves the steps of forming a photoresist layer on a wafer, forming a protective coating on the photoresist layer from a resist overlay material, exposing the layer structure to light, and developing. The process is characterized in that the resist overlay material is the water-insoluble, alkali-soluble resist protective coating material defined above.

Specifically, first the water-insoluble, alkali-soluble resist protective coating material (resist overlay material) is applied to a photoresist layer on a wafer by suitable techniques, typically spin coating. The coating thickness is preferably in a range of 10 to 500 nm. The lithography used herein may be either dry lithography wherein a gas such as air or nitrogen is present between the resist protective coating and the projection lens, or immersion lithography wherein a liquid fills in between the resist protective coating and the projection lens. The immersion lithography favors water. In the immersion lithography, whether or not the wafer edge and rear side are cleaned and the cleaning technique are important in preventing flowing of water to the wafer rear side and leaching from the substrate. After spin coating, the resist protective coating is baked at a temperature of 40 to 130° C. for 10 to 300 seconds for evaporating off the solvent. In the case of resist layer formation and dry lithography, edge cleaning is performed during the spin coating. In the case of immersion lithography, contact of water with the substrate surface which is fully hydrophilic is undesirable because water may be left on the substrate surface at the edge. It is then recommended to omit edge cleaning during the spin coating of the resist protective coating.

Once the resist protective coating is formed, light exposure in water is carried out by KrF or ArF immersion lithography. This is followed by post-exposure bake (PEB) and development in an alkaline developer for 10 to 300 seconds. An aqueous solution of 2.38 wt % tetramethylammonium hydroxide (TMAH), which is commonly used as the alkaline developer, is used herein whereby stripping of the resist protective coating and development of the resist layer are simultaneously effected. Sometimes water is left on the resist protective coating prior to PEB. If PEB is performed in the presence of residual water, water can penetrate through the protective coating to suck up the acid in the resist, impeding pattern formation. To fully remove the water on the protective coating prior to PEB, the water on the protective coating should be dried or recovered (post-soaking recovery) by suitable means, for example, spin drying prior to PEB, purging of the protective coating surface with dry air or nitrogen, or optimizing the water recovery nozzle configuration or process on a stage after the exposure. Additionally, the resist protective coating of the invention has high water repellency and thus offers the advantage of efficient water recovery.

The type of photoresist material is not particularly limited. The photoresist may be either positive or negative working and also either a monolayer resist of conventional hydrocarbon or a bilayer resist containing silicon atoms and the like. For KrF lithography resist materials, the preferred base resins are polyhydroxystyrene or polyhydroxystyrene-(meth)acrylate copolymers in which some or all hydrogen atoms of hydroxyl or carboxyl groups are replaced by acid labile groups.

For ArF lithography resist materials, the base resin must have an aromatic-free structure. Illustrative polymers include polyacrylic acid and derivatives thereof, norbornene derivative-maleic anhydride alternating copolymers and ternary or quaternary copolymers thereof with polyacrylic acid or derivatives thereof, tetracyclododecene derivative-maleic anhydride alternating copolymers and ternary or quaternary copolymers thereof with polyacrylic acid or derivatives thereof, norbornene derivative-maleimide alternating copolymers and ternary or quaternary copolymers thereof with polyacrylic acid or derivatives thereof, tetracyclododecene derivative-maleimide alternating copolymers and ternary or quaternary copolymers thereof with polyacrylic acid or derivatives thereof, and polynorbornene and metathesis ring-opening polymers, which may be used alone or in a combination of any.

Resist materials for use with mask blanks often include novolac resins and hydroxystyrene based resins. Those resins in which hydroxyl groups are substituted by acid labile groups are used for positive resists while these resins in combination with crosslinking agents are used for negative resists. Base polymers which can be used herein include copolymers of hydroxystyrene with one or more of (meth)acrylic derivatives, styrenes, vinyl naphthalenes, vinyl anthracenes, vinyl pyrenes, hydroxyvinyl naphthalenes, hydroxyvinyl anthracenes, indenes, hydroxyindenes, acenaphthylenes, and norbornadienes.

In the case of a resist protective coating for use with mask blanks, a photoresist material is coated on a mask blank substrate of $SiO_2$, Cr, CrO, CrN, MoSi or the like before a resist protective coating is formed thereon. By further forming a SOG film and an organic undercoat film between the photoresist and the blank substrate, there is provided a three-layer structure which is also acceptable herein. Once the resist protective coating is formed, the structure is exposed to light in vacuum using an electron beam exposure system. The exposure is followed by post-exposure baking (PEB) and development in an alkaline developer for 10 to 300 seconds.

EXAMPLE

Examples of the invention are given below by way of illustration and not by way of limitation. The abbreviations used herein are GPC for gel permeation chromatography, NMR for nuclear magnetic resonance, Mw for weight average molecular weight, Mn for number average molecular weight, and Mw/Mn for molecular weight dispersity. Mw and Mn are determined by GPC versus polystyrene standards.

Monomers 1 to 20 used in Synthesis Examples are identified below by their structural formula.

Monomer 1

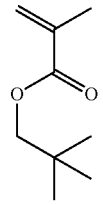

Monomer 2

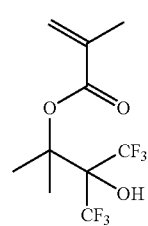

Monomer 3

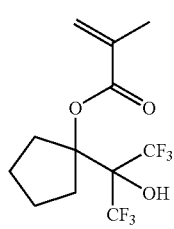

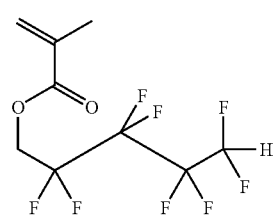

Monomer 4

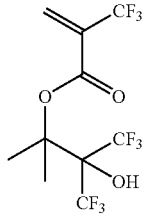

Monomer 5

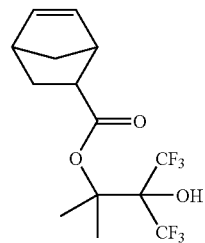

Monomer 6

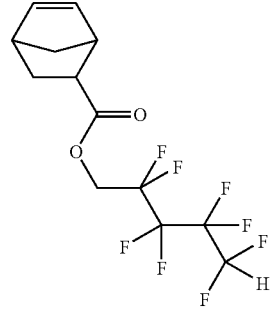

Monomer 7

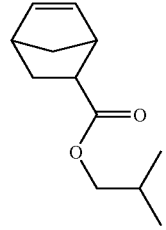

Monomer 8

Monomer 9

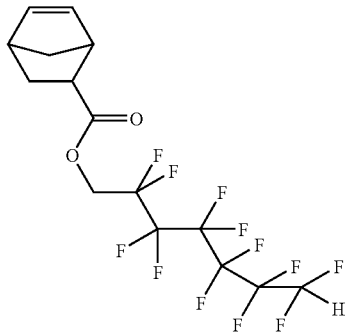

Monomer 10

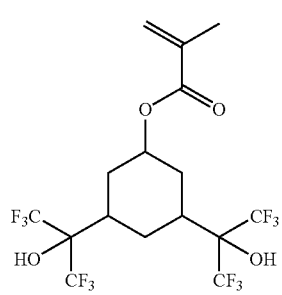

Monomer 11

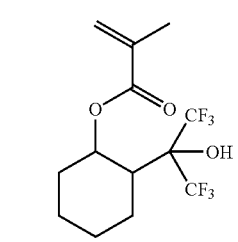

Monomer 12

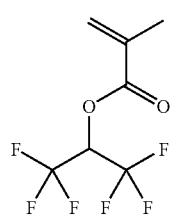

Monomer 13

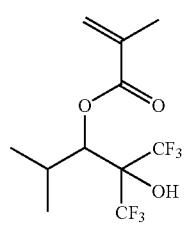

Monomer 14

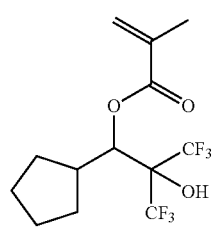

Monomer 15

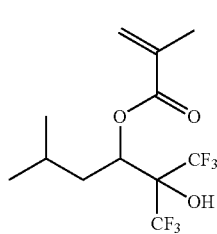

Monomer 16

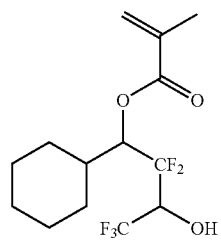

Monomer 17

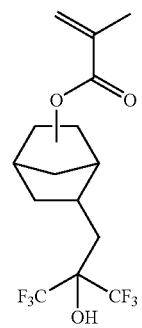

Monomer 18

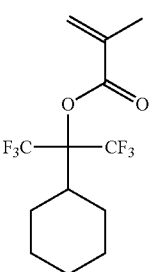

Monomer 19

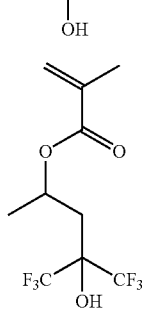

Monomer 20

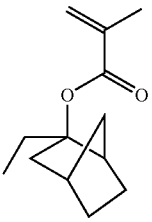

Synthesis Example 1

A 200-ml flask was charged with 29 g of Monomer 1 and 40 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 1, was analyzed for composition by ¹H-NMR and for molecular weight by GPC.

Inventive Polymer 1

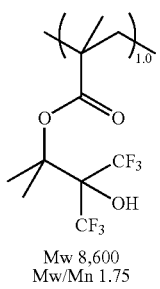

Mw 8,600
Mw/Mn 1.75

Synthesis Example 2

A 200-ml flask was charged with 32 g of Monomer 2 and 40 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 2, was analyzed for composition by ¹H-NMR and for molecular weight by GPC.

Inventive Polymer 2

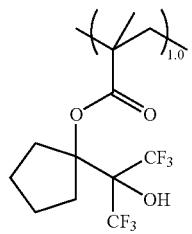

Mw 7,100
Mw/Mn 1.65

Synthesis Example 3

A 200-ml flask was charged with 20.3 g of Monomer 1, 4.5 g of Monomer 3, 2.3 g of Monomer 4, and 40 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 3, was analyzed for composition by ¹H-NMR and for molecular weight by GPC.

Inventive Polymer 3

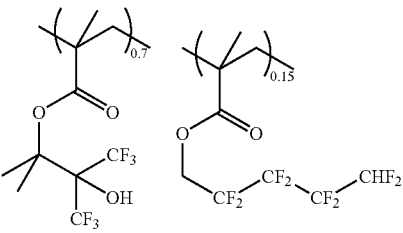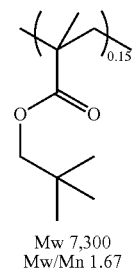

Mw 7,300
Mw/Mn 1.67

Synthesis Example 4

A 200-ml flask was charged with 20.3 g of Monomer 1, 9.0 g of Monomer 3, and 40 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 4, was analyzed for composition by ¹H-NMR and for molecular weight by GPC.

Inventive Polymer 4

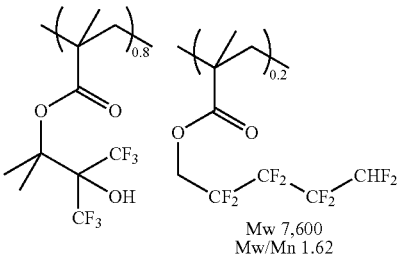

Mw 7,600
Mw/Mn 1.62

Synthesis Example 5

A 200-ml flask was charged with 24.3 g of Monomer 5, 6.3 g of Monomer 7, 3.7 g of Monomer 8, and 20 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 85° C., and held for 25 hours for reaction. The reaction solution was poured into hexane for crystallization whereupon the resin was isolated. The resin, designated Inventive Polymer 5, was analyzed for composition by ¹H-NMR and for molecular weight by GPC.

Inventive Polymer 5

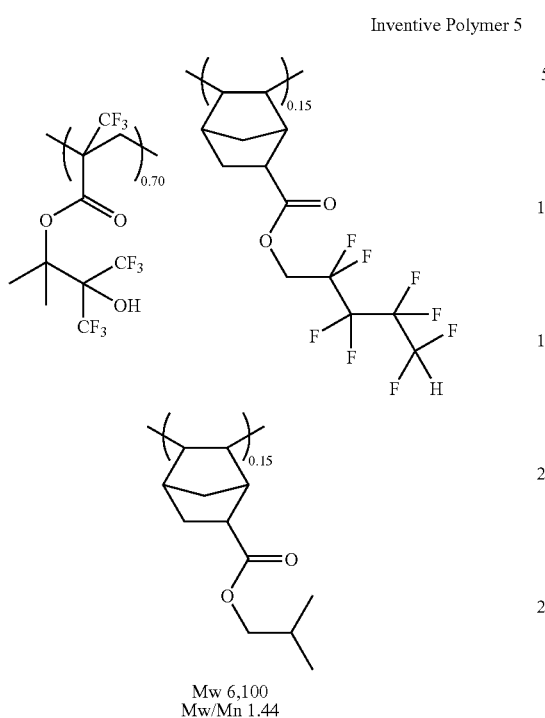

Mw 6,100
Mw/Mn 1.44

Synthesis Example 6

A 200-ml flask was charged with 24.3 g of Monomer 5, 3.7 g of Monomer 6, 9.4 g of Monomer 9, and 20 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 85° C., and held for 25 hours for reaction. The reaction solution was poured into hexane for crystallization whereupon the resin was isolated. The resin, designated Inventive Polymer 6, was analyzed for composition by ¹H-NMR and for molecular weight by GPC.

Inventive Polymer 6

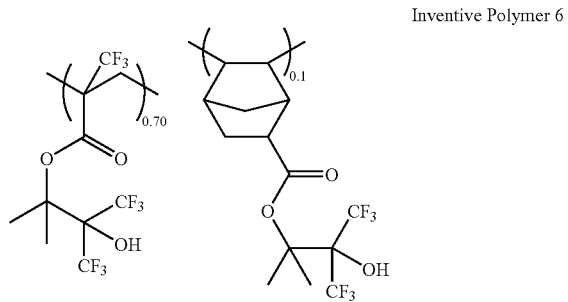

-continued

Mw 5,600
Mw/Mn 1.48

Synthesis Example 7

A 200-ml flask was charged with 22.5 g of Monomer 1, 5.9 g of Monomer 12, and 40 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 7, was analyzed for composition by ¹H-NMR and for molecular weight by GPC.

Inventive Polymer 7

Mw 7,200
Mw/Mn 1.61

Synthesis Example 8

A 200-ml flask was charged with 30.8 g of Monomer 13 and 40 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 8, was analyzed for composition by ¹H-NMR and for molecular weight by GPC.

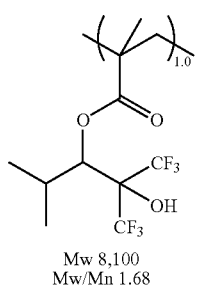

Inventive Polymer 8

Mw 8,100
Mw/Mn 1.68

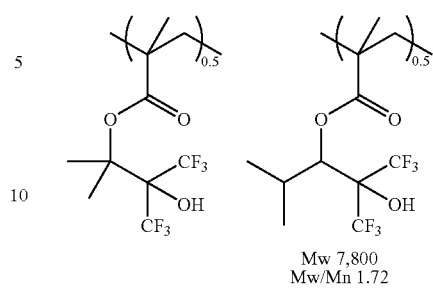

Inventive Polymer 10

Mw 7,800
Mw/Mn 1.72

Synthesis Example 9

A 200-ml flask was charged with 33.4 g of Monomer 14 and 40 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 9, was analyzed for composition by $^1$H-NMR and for molecular weight by GPC.

Synthesis Example 11

A 200-ml flask was charged with 14.7 g of Monomer 1, 16.7 g of Monomer 14, and 40 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 11, was analyzed for composition by $^1$H-NMR and for molecular weight by GPC.

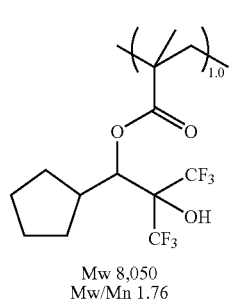

Inventive Polymer 9

Mw 8,050
Mw/Mn 1.76

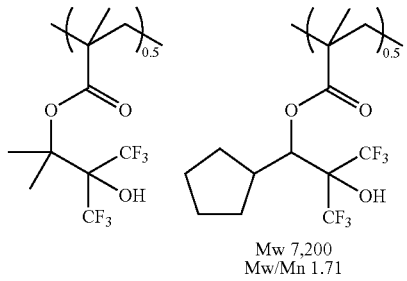

Inventive Polymer 11

Mw 7,200
Mw/Mn 1.71

Synthesis Example 10

A 200-ml flask was charged with 14.7 g of Monomer 1, 15.4 g of Monomer 13, and 40 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 10, was analyzed for composition by $^1$H-NMR and for molecular weight by GPC.

Synthesis Example 12

A 200-ml flask was charged with 20.5 g of Monomer 1, 9.7 g of Monomer 15, and 40 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 12, was analyzed for composition by $^1$H-NMR and for molecular weight by GPC.

Inventive Polymer 12

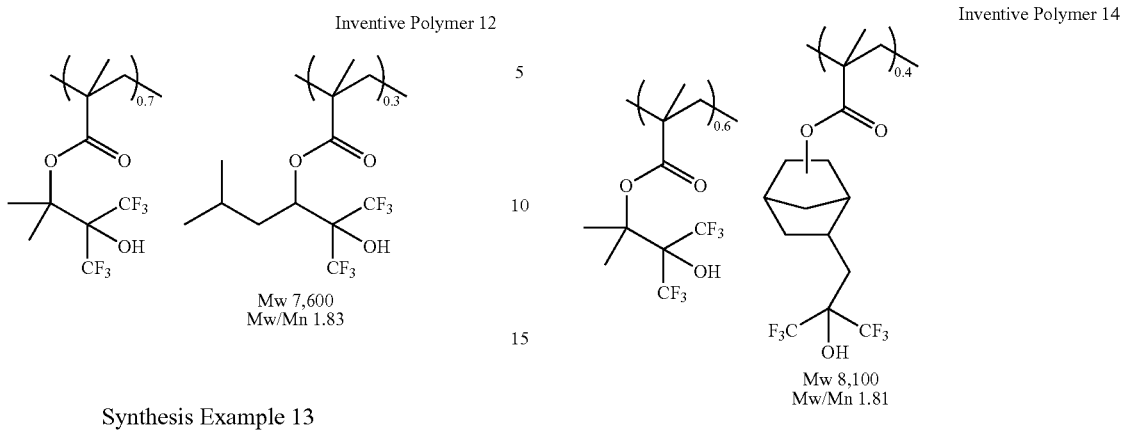

Inventive Polymer 14

Synthesis Example 13

A 200-ml flask was charged with 23.5 g of Monomer 1, 6.6 g of Monomer 16, and 40 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 13, was analyzed for composition by $^1$H-NMR and for molecular weight by GPC.

Synthesis Example 15

A 200-ml flask was charged with 23.5 g of Monomer 1, 9.7 g of Monomer 18, and 40 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 15, was analyzed for composition by $^1$H-NMR and for molecular weight by GPC.

Inventive Polymer 13

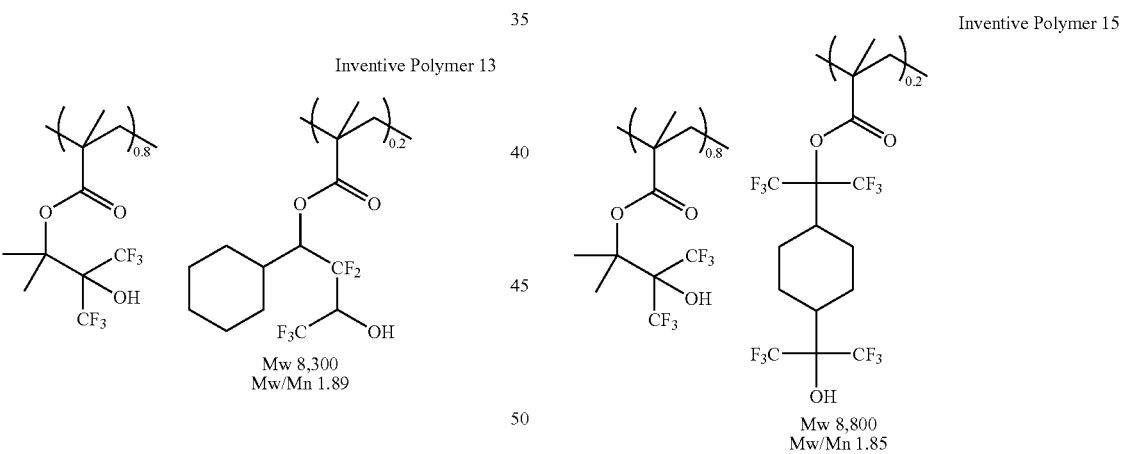

Inventive Polymer 15

Synthesis Example 14

A 200-ml flask was charged with 17.6 g of Monomer 1, 14.4 g of Monomer 17, and 40 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 14, was analyzed for composition by $^1$H-NMR and for molecular weight by GPC.

Synthesis Example 16

A 200-ml flask was charged with 11.8 g of Monomer 1, 14.4 g of Monomer 17, 10.0 g of Monomer 10, and 40 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 16, was analyzed for composition by $^1$H-NMR and for molecular weight by GPC.

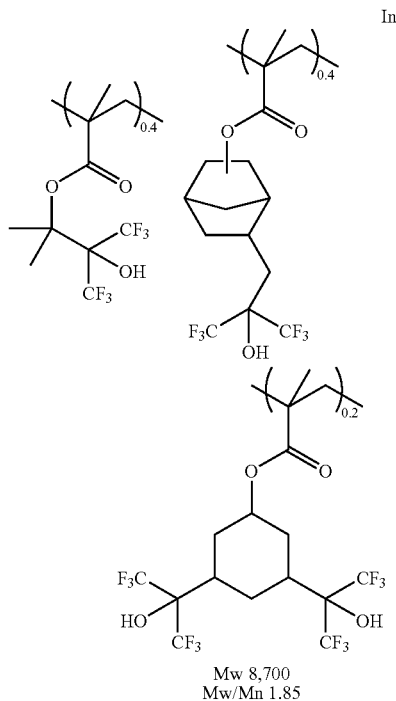

Inventive Polymer 16

Mw 8,700
Mw/Mn 1.85

Synthesis Example 17

A 200-ml flask was charged with 23.5 g of Monomer 1, 4.2 g of Monomer 20, and 40 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 17, was analyzed for composition by $^1$H-NMR and for molecular weight by GPC.

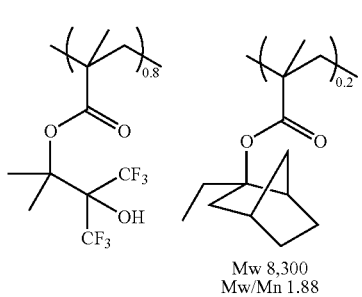

Inventive Polymer 17

Mw 8,300
Mw/Mn 1.88

Synthesis Example 18

A 200-ml flask was charged with 11.8 g of Monomer 1, 14.4 g of Monomer 17, 2.6 g of hydroxyethyl methacrylate, and 40 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 18, was analyzed for composition by $^1$H-NMR and for molecular weight by GPC.

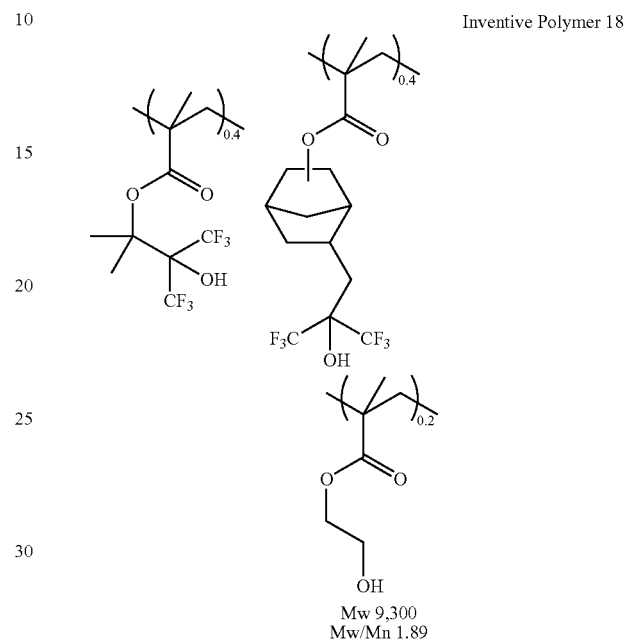

Inventive Polymer 18

Mw 9,300
Mw/Mn 1.89

Comparative Synthesis Example 1

A 200-ml flask was charged with 35 g of Monomer 10 and 40 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Comparative Polymer 1, was analyzed for composition by $^1$H-NMR and for molecular weight by GPC.

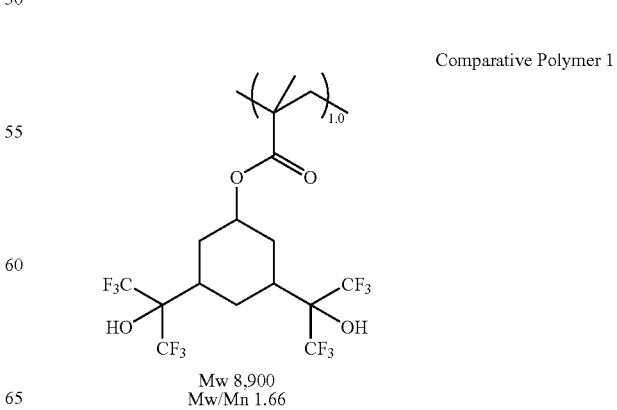

Comparative Polymer 1

Mw 8,900
Mw/Mn 1.66

Comparative Synthesis Example 2

A 200-ml flask was charged with 28 g of Monomer 11 and 40 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Comparative Polymer 2, was analyzed for composition by $^1$H-NMR and for molecular weight by GPC.

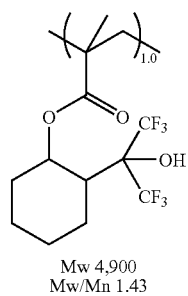

Comparative Polymer 2

Mw 4,900
Mw/Mn 1.43

Comparative Synthesis Example 3

A 200-ml flask was charged with 27.3 g of Monomer 10, 9 g of Monomer 3, and 40 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Comparative Polymer 3, was analyzed for composition by $^1$H-NMR and for molecular weight by GPC.

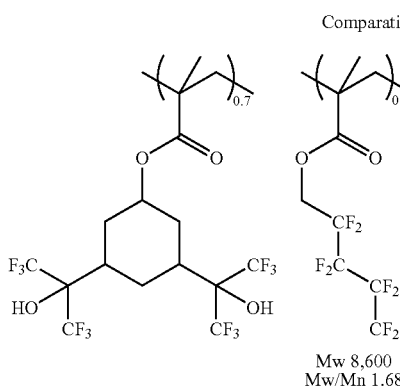

Comparative Polymer 3

Mw 8,600
Mw/Mn 1.68

Comparative Synthesis Example 4

A 200-ml flask was charged with 29.4 g of Monomer 19 and 40 g of methanol as a solvent. The reactor was cooled to −70° C. in a nitrogen atmosphere, followed by three cycles of vacuum evacuation and nitrogen flow. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Comparative Polymer 4, was analyzed for composition by $^1$H-NMR and for molecular weight by GPC.

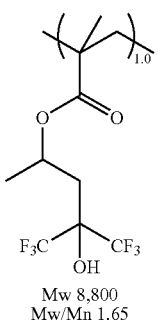

Comparative Polymer 4

Mw 8,800
Mw/Mn 1.65

Examples and Comparative Examples

Inventive Polymers 1 to 18 and Comparative Polymers 1 to 4 are the polymers prepared in corresponding Synthesis Examples described above.

Resist protective coating solutions TC-1 to 6, TC-10 to 21, and Comparative-TC-1 to 4 were prepared by dissolving 0.5 g of each of Inventive Polymers 1 to 18 and Comparative Polymers 1 to 4 in 16 g of diisopentyl ether and 2 g of 2-methyl-1-butanol and filtering through a polypropylene filter with a pore size of 0.2 μm. In the case of resist protective coatings TC-7 to 9, TC-22 to 25, resist protective coating solutions were similarly prepared aside from using as the solvent 18 g of diisopentyl ether for TC-7, 12 g of diisopentyl ether and 8 g of 3-methyl-1-butanol for TC-8, 18 g of 2,2,2-trifluoroethyl butyrate for TC-9, 12 g of diisopentyl ether and 8 g of 4-methyl-2-pentanol for TC-22, 5 g of di-n-butyl ether and 25 g of 3-methyl-1-butanol for TC-23, 18 g of di-n-pentyl ether and 2 g of 2-methyl-1-butanol for TC-24, and 16 g of diisopentyl ether and 2 g of 2-heptanol for TC-25.

The resist protective coating solutions were spin coated onto silicon substrates and baked at 100° C. for 60 seconds to form protective coatings TC-1 to 25 and Comparative-TC-1 to 4 of 50 nm thick. Using a spectroscopic ellipsometer of J. A. Woollam Co., the refractive index at wavelength 193 nm of the protective coatings was determined. The results are shown in Table 1.

TABLE 1

| Resist protective coating | Polymer | Refractive index @193 nm |
| --- | --- | --- |
| TC-1 | Inventive Polymer 1 | 1.56 |
| TC-2 | Inventive Polymer 2 | 1.58 |
| TC-3 | Inventive Polymer 3 | 1.55 |
| TC-4 | Inventive Polymer 4 | 1.54 |
| TC-5 | Inventive Polymer 5 | 1.55 |
| TC-6 | Inventive Polymer 6 | 1.55 |
| TC-7 | Inventive Polymer 4 | 1.54 |
| TC-8 | Inventive Polymer 4 | 1.54 |
| TC-9 | Inventive Polymer 4 | 1.54 |
| TC-10 | Inventive Polymer 7 | 1.55 |
| TC-11 | Inventive Polymer 8 | 1.56 |

TABLE 1-continued

| Resist protective coating | Polymer | Refractive index @193 nm |
|---|---|---|
| TC-12 | Inventive Polymer 9 | 1.56 |
| TC-13 | Inventive Polymer 10 | 1.55 |
| TC-14 | Inventive Polymer 11 | 1.56 |
| TC-15 | Inventive Polymer 12 | 1.56 |
| TC-16 | Inventive Polymer 13 | 1.57 |
| TC-17 | Inventive Polymer 14 | 1.57 |
| TC-18 | Inventive Polymer 15 | 1.53 |
| TC-19 | Inventive Polymer 16 | 1.54 |
| TC-20 | Inventive Polymer 17 | 1.56 |
| TC-21 | Inventive Polymer 18 | 1.55 |
| TC-22 | Inventive Polymer 4 | 1.54 |
| TC-23 | Inventive Polymer 4 | 1.54 |
| TC-24 | Inventive Polymer 4 | 1.54 |
| TC-25 | Inventive Polymer 4 | 1.54 |
| Comparative-TC-1 | Comparative Polymer 1 | 1.54 |
| Comparative-TC-2 | Comparative Polymer 2 | 1.56 |
| Comparative-TC-3 | Comparative Polymer 3 | 1.53 |
| Comparative-TC-4 | Comparative Polymer 4 | 1.56 |

The wafers on which the resist protective coatings had been formed by the above procedure were rinsed with deionized water for 5 minutes. A change of coating thickness was examined. The results are shown in Table 2.

TABLE 2

| Resist protective coating | Polymer | Coating thickness change before and after rinsing (nm) |
|---|---|---|
| TC-1 | Inventive Polymer 1 | 0 |
| TC-2 | Inventive Polymer 2 | 0 |
| TC-3 | Inventive Polymer 3 | 0 |
| TC-4 | Inventive Polymer 4 | 0 |
| TC-5 | Inventive Polymer 5 | 0 |
| TC-6 | Inventive Polymer 6 | 0 |
| TC-7 | Inventive Polymer 4 | 0 |
| TC-8 | Inventive Polymer 4 | 0 |
| TC-9 | Inventive Polymer 4 | 0 |
| TC-10 | Inventive Polymer 7 | 0 |
| TC-11 | Inventive Polymer 8 | 0 |
| TC-12 | Inventive Polymer 9 | 0 |
| TC-13 | Inventive Polymer 10 | 0 |
| TC-14 | Inventive Polymer 11 | 0 |
| TC-15 | Inventive Polymer 12 | 0 |
| TC-16 | Inventive Polymer 13 | 0 |
| TC-17 | Inventive Polymer 14 | 0 |
| TC-18 | Inventive Polymer 15 | 0 |
| TC-19 | Inventive Polymer 16 | 0 |
| TC-20 | Inventive Polymer 17 | 0 |
| TC-21 | Inventive Polymer 18 | 0 |
| TC-22 | Inventive Polymer 4 | 0 |
| TC-23 | Inventive Polymer 4 | 0 |
| TC-24 | Inventive Polymer 4 | 0 |
| TC-25 | Inventive Polymer 4 | 0 |
| Comparative-TC-1 | Comparative Polymer 1 | 0 |
| Comparative-TC-2 | Comparative Polymer 2 | 0 |
| Comparative-TC-3 | Comparative Polymer 3 | 0 |
| Comparative-TC-4 | Comparative Polymer 4 | 0 |

The wafers on which the resist protective coatings had been formed by the above procedure were developed with a 2.38 wt % tetramethylammonium hydroxide (TMAH) aqueous solution for 60 seconds. Changes of coating thickness were observed. The results are shown in Table 3.

TABLE 3

| Resist protective coating | Polymer | Coating thickness after development (nm) |
|---|---|---|
| TC-1 | Inventive Polymer 1 | 0 |
| TC-2 | Inventive Polymer 2 | 0 |
| TC-3 | Inventive Polymer 3 | 0 |
| TC-4 | Inventive Polymer 4 | 0 |
| TC-5 | Inventive Polymer 5 | 0 |
| TC-6 | Inventive Polymer 6 | 0 |
| TC-7 | Inventive Polymer 4 | 0 |
| TC-8 | Inventive Polymer 4 | 0 |
| TC-9 | Inventive Polymer 4 | 0 |
| TC-10 | Inventive Polymer 7 | 0 |
| TC-11 | Inventive Polymer 8 | 0 |
| TC-12 | Inventive Polymer 9 | 0 |
| TC-13 | Inventive Polymer 10 | 0 |
| TC-14 | Inventive Polymer 11 | 0 |
| TC-15 | Inventive Polymer 12 | 0 |
| TC-16 | Inventive Polymer 13 | 0 |
| TC-17 | Inventive Polymer 14 | 0 |
| TC-18 | Inventive Polymer 15 | 0 |
| TC-19 | Inventive Polymer 16 | 0 |
| TC-20 | Inventive Polymer 17 | 0 |
| TC-21 | Inventive Polymer 18 | 0 |
| TC-22 | Inventive Polymer 4 | 0 |
| TC-23 | Inventive Polymer 4 | 0 |
| TC-24 | Inventive Polymer 4 | 0 |
| TC-25 | Inventive Polymer 4 | 0 |
| Comparative-TC-1 | Comparative Polymer 1 | 0 |
| Comparative-TC-2 | Comparative Polymer 2 | 24 |
| Comparative-TC-3 | Comparative Polymer 3 | 0 |
| Comparative-TC-4 | Comparative Polymer 4 | 0 |

An inclination contact angle meter Drip Master 500 by Kyowa Interface Science Co., Ltd. was used. On the wafers with the resist protective coatings which were kept horizontal, 50 μL of deionized water was dripped to form a droplet. While the wafers were gradually inclined, the angle (sliding angle) at which the droplet started sliding down was determined as well as receding contact angle. The results are shown in Table 4.

TABLE 4

| Resist protective coating | Polymer | Sliding angle (°) | Receding contact angle (°) |
|---|---|---|---|
| TC-1 | Inventive Polymer 1 | 19 | 73 |
| TC-2 | Inventive Polymer 2 | 16 | 75 |
| TC-3 | Inventive Polymer 3 | 13 | 78 |
| TC-4 | Inventive Polymer 4 | 14 | 77 |
| TC-5 | Inventive Polymer 5 | 8 | 83 |
| TC-6 | Inventive Polymer 6 | 9 | 83 |
| TC-7 | Inventive Polymer 4 | 13 | 78 |
| TC-8 | Inventive Polymer 4 | 13 | 78 |
| TC-9 | Inventive Polymer 4 | 13 | 79 |
| TC-10 | Inventive Polymer 7 | 17 | 73 |
| TC-11 | Inventive Polymer 8 | 17 | 77 |
| TC-12 | Inventive Polymer 9 | 17 | 78 |
| TC-13 | Inventive Polymer 10 | 15 | 74 |
| TC-14 | Inventive Polymer 11 | 16 | 75 |
| TC-15 | Inventive Polymer 12 | 16 | 74 |
| TC-16 | Inventive Polymer 13 | 17 | 73 |
| TC-17 | Inventive Polymer 14 | 16 | 72 |
| TC-18 | Inventive Polymer 15 | 17 | 74 |
| TC-19 | Inventive Polymer 16 | 17 | 70 |
| TC-20 | Inventive Polymer 17 | 18 | 70 |
| TC-21 | Inventive Polymer 18 | 18 | 69 |
| TC-22 | Inventive Polymer 4 | 15 | 75 |
| TC-23 | Inventive Polymer 4 | 14 | 77 |
| TC-24 | Inventive Polymer 4 | 13 | 77 |
| TC-25 | Inventive Polymer 4 | 15 | 75 |

TABLE 4-continued

| Resist protective coating | Polymer | Sliding angle (°) | Receding contact angle (°) |
|---|---|---|---|
| Comparative-TC-1 | Comparative Polymer 1 | 24 | 61 |
| Comparative-TC-2 | Comparative Polymer 2 | 26 | 58 |
| Comparative-TC-3 | Comparative Polymer 3 | 18 | 63 |
| Comparative-TC-4 | Comparative Polymer 4 | 15 | 73 |

While the wafers on which the resist protective coatings had been formed by the above procedure were developed with a 2.38 wt % TMAH aqueous solution, a rate of alkali dissolution was determined using a dissolution rate monitor Model RDA-790 (Litho Tech Japan Co., Ltd.). The results are shown in Table 5.

TABLE 5

| Resist protective coating | Polymer | Alkali dissolution rate (nm/sec) |
|---|---|---|
| TC-1 | Inventive Polymer 1 | 1,040 |
| TC-4 | Inventive Polymer 4 | 200 |
| Comparative-TC-1 | Comparative Polymer 1 | 1,500 |
| Comparative-TC-4 | Comparative Polymer 4 | 44 |

A smaller sliding angle indicates an easier flow of water on the coating. A larger receding contact angle indicates that fewer liquid droplets are left during high-speed scan exposure. The polymers having alkali dissolvable groups within the scope of the invention have a high alkali dissolution rate comparable to those polymers having two hexafluoroalcohol groups and are characterized by improved water slippage as demonstrated by a smaller sliding angle and a larger receding contact angle.

In another run, a resist solution was prepared by dissolving 5 g of a resist polymer, shown below, 0.25 g of a photoacid generator PAG1, shown below, and 0.6 g of tri-n-butylamine as a quencher in 55 g of propylene glycol monomethyl ether acetate (PGMEA) and filtering through a polypropylene filter having a pore size of 0.2 μm. An antireflective coating ARC-29A (Nissan Chemical Co., Ltd.) was formed on a silicon substrate to a thickness of 87 nm. The resist solution was applied onto the antireflective coating and baked at 120° C. for 60 seconds, forming a resist film of 150 nm thick. The resist protective coating solution was applied onto the resist film and baked at 100° C. for 60 seconds. In order to simulate immersion lithography, light exposure was followed by rinsing of the coating with deionized water for 5 minutes. The structure was exposed by means of an ArF scanner model S307E (Nikon Corp., NA 0.85, a 0.93, 4/5 annular illumination, 6% halftone phase shift mask), rinsed for 5 minutes while splashing deionized water, post-exposure baked (PEB) at 110° C. for 60 seconds, and developed with a 2.38 wt % TMAH aqueous solution for 60 seconds.

In the absence of the protective coating, a similar process including light exposure, water rinsing, PEB and development was carried out; and a conventional process excluding water rinsing after exposure was also carried out.

The wafers were sectioned for comparing the profile of 75-nm line-and-space pattern and sensitivity. The results are shown in Table 6.

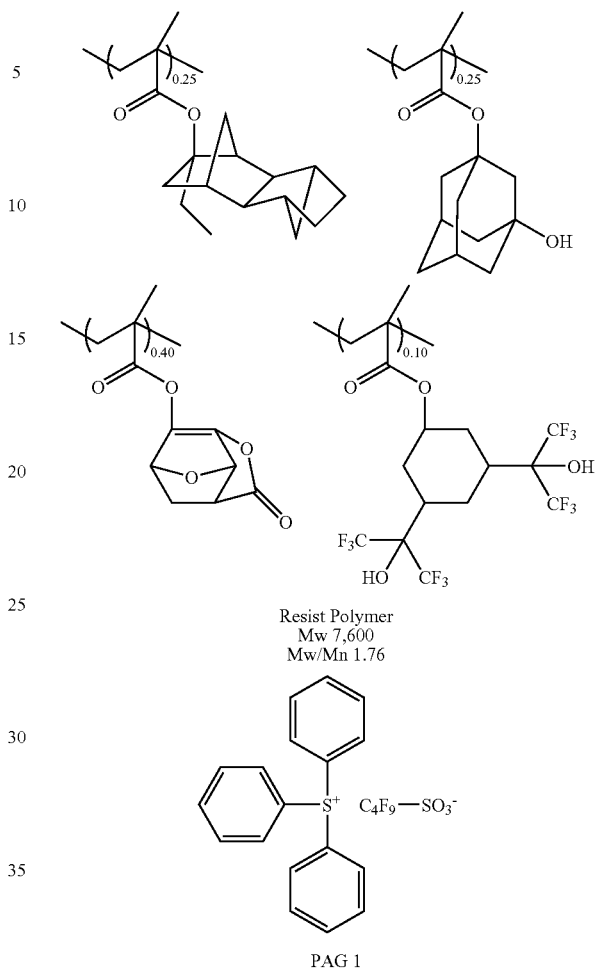

Resist Polymer
Mw 7,600
Mw/Mn 1.76

PAG 1

TABLE 6

| Resist protective coating | Polymer | Sensitivity | 75-nm pattern profile |
|---|---|---|---|
| no protective coating, conventional process excluding rinsing after exposure | | 31 mJ/cm² | rectangular |
| TC-1 | Inventive Polymer 1 | 30 mJ/cm² | rectangular |
| TC-2 | Inventive Polymer 2 | 30 mJ/cm² | rectangular |
| TC-3 | Inventive Polymer 3 | 30 mJ/cm² | rectangular |
| TC-4 | Inventive Polymer 4 | 30 mJ/cm² | rectangular |
| TC-5 | Inventive Polymer 5 | 30 mJ/cm² | rectangular |
| TC-6 | Inventive Polymer 6 | 30 mJ/cm² | rectangular |
| TC-7 | Inventive Polymer 4 | 30 mJ/cm² | rectangular |
| TC-8 | Inventive Polymer 4 | 30 mJ/cm² | rectangular |
| TC-9 | Inventive Polymer 4 | 30 mJ/cm² | rectangular |
| TC-10 | Inventive Polymer 7 | 30 mJ/cm² | rectangular |
| TC-11 | Inventive Polymer 8 | 30 mJ/cm² | rectangular |
| TC-12 | Inventive Polymer 9 | 30 mJ/cm² | rectangular |
| TC-13 | Inventive Polymer 10 | 30 mJ/cm² | rectangular |
| TC-14 | Inventive Polymer 11 | 30 mJ/cm² | rectangular |
| TC-15 | Inventive Polymer 12 | 30 mJ/cm² | rectangular |
| TC-16 | Inventive Polymer 13 | 30 mJ/cm² | rectangular |
| TC-17 | Inventive Polymer 14 | 30 mJ/cm² | rectangular |
| TC-18 | Inventive Polymer 15 | 30 mJ/cm² | rectangular |
| TC-19 | Inventive Polymer 16 | 30 mJ/cm² | rectangular |
| TC-20 | Inventive Polymer 17 | 30 mJ/cm² | rectangular |
| TC-21 | Inventive Polymer 18 | 30 mJ/cm² | rectangular |
| TC-22 | Inventive Polymer 4 | 30 mJ/cm² | rectangular |

TABLE 6-continued

| Resist protective coating | Polymer | Sensitivity | 75-nm pattern profile |
|---|---|---|---|
| TC-23 | Inventive Polymer 4 | 30 mJ/cm$^2$ | rectangular |
| TC-24 | Inventive Polymer 4 | 30 mJ/cm$^2$ | rectangular |
| TC-25 | Inventive Polymer 4 | 30 mJ/cm$^2$ | rectangular |
| no protective coating | | 32 mJ/cm$^2$ | T-top |
| Comparative-TC-1 | Comparative Polymer 1 | 29 mJ/cm$^2$ | slimmed and tapered |
| Comparative-TC-2 | Comparative Polymer 2 | 29 mJ/cm$^2$ | slimmed and tapered |

In a further run, the resist solution and the protective coating solution, both prepared above, were refined by three passes of precision filtering through a high-density polyethylene filter with a pore size of 0.02 μm. The resist solution was applied onto an antireflective coating ARC-29A (Nissan Chemical Co., Ltd.) of 87 nm thick formed on a 200-mm diameter silicon substrate and baked at 120° C. for 60 seconds, forming a resist film of 150 nm thick. The resist protective coating solution was applied onto the resist film and baked at 100° C. for 60 seconds. The structure was dry exposed by means of an ArF scanner model S307E (Nikon Corp., NA 0.85, σ0.93, 4/5 annular illumination, 6% halftone phase shift mask), post-exposure baked (PEB) at 110° C. for 60 seconds, and developed with a 2.38 wt % TMAH aqueous solution for 60 seconds, forming a 100-nm line-and-space pattern over the wafer surface. Using a flaw detector Win-Win 50-1400 (Tokyo Seimitsu Co., Ltd.), defects were observed at the pixel size of 0.165 μm. The results are shown in Table 7. Most defects found in Comparative-TC-4 were bridge-like defects between lines.

TABLE 7

| Resist protective coating | Polymer | Number of defects |
|---|---|---|
| TC-1 | Inventive Polymer 1 | 3 |
| TC-4 | Inventive Polymer 4 | 4 |
| Comparative-TC-1 | Comparative Polymer 1 | 4 |
| Comparative-TC-4 | Comparative Polymer 4 | ~1,000 |

EB Exposure

In an EB exposure test, a positive resist material was prepared by dissolving an EB lithographic resist polymer synthesized by radical polymerization, an acid generator and a basic compound, all shown below, in propylene glycol monomethyl ether acetate (PGMEA) and ethyl lactate (EL) according to the recipe shown in Table 6, and filtering through a filter with a pore size of 0.2 μm.

Using Clean Track Mark 5 (Tokyo Electron Ltd.), the positive resist material was spin coated on a silicon substrate with a diameter of 6 inches and prebaked on a hot plate at 110° C. for 60 seconds to form a resist film of 200 nm thick. Then, a resist protective coating solution was applied on the resist film and baked at 100° C. for 60 seconds to form a resist protective coating film have a thickness of 50 nm. Using HL-800D (Hitachi, Ltd.) at a HV voltage of 50 keV, imagewise exposure was performed on the resist film in a vacuum chamber. The resist film was then allowed to stand in the vacuum chamber for 20 hours, after which additional imagewise exposure was performed at a different area.

Using Clean Track Mark 5 (Tokyo Electron Ltd.), immediately after the imagewise exposure, the resist film was post-exposure baked (PEB) on a hot plate at 90° C. for 60 seconds and puddle developed in a 2.38 wt % TMAH aqueous solution for 30 seconds to form a positive pattern. The resist pattern was evaluated as follows.

Using a measurement SEM S-7280 (Hitachi, Ltd.), the line width of a 0.12 μm line-and-space pattern at the exposure dose which provided a 1:1 resolution at the top and bottom of a 0.12 μm line-and-space pattern in the area exposed immediately before exposure was measured. A width change during vacuum holding was determined by subtracting therefrom the line width of a 0.12 μm line-and-space pattern at the same exposure dose in the area exposed 20 hours earlier. Positive values of width change indicate that the resist sensitivity varies toward a higher level during vacuum holding whereas negative values indicate that the resist sensitivity varies toward a lower level.

TABLE 8

| Polymer (pbw) | Photoacid generator (pbw) | Basic compound (pbw) | Organic solvent (pbw) | Protective film | Width change |
|---|---|---|---|---|---|
| EB resist polymer (100) | PAG 2 (10) | Quencher 1 (0.4) | PGMEA(700) EL(300) | TC-1 | −1 nm |
| EB resist polymer (100) | PAG 2 (10) | Quencher 1 (0.4) | PGMEA(700) EL(300) | TC-2 | 0 nm |
| EB resist polymer (100) | PAG 2 (10) | Quencher 1 (0.4) | PGMEA(700) EL(300) | TC-3 | −1 nm |
| EB resist polymer (100) | PAG 2 (10) | Quencher 1 (0.4) | PGMEA(700) EL(300) | TC-4 | −1 nm |
| EB resist polymer (100) | PAG 2 (10) | Quencher 1 (0.4) | PGMEA(700) EL(300) | TC-5 | 0 nm |
| EB resist polymer (100) | PAG 2 (10) | Quencher 1 (0.4) | PGMEA(700) EL(300) | TC-6 | −1 nm |
| EB resist polymer (100) | PAG 2 (10) | Quencher 1 (0.4) | PGMEA(700) EL(300) | TC-7 | −1 nm |
| EB resist polymer (100) | PAG 2 (10) | Quencher 1 (0.4) | PGMEA(700) EL(300) | TC-8 | −1 nm |
| EB resist polymer (100) | PAG 2 (10) | Quencher 1 (0.4) | PGMEA(700) EL(300) | TC-9 | 0 nm |
| EB resist polymer (100) | PAG 2 (10) | Quencher 1 (0.4) | PGMEA(700) EL(300) | TC-10 | −1 nm |

TABLE 8-continued

| Polymer (pbw) | Photoacid generator (pbw) | Basic compound (pbw) | Organic solvent (pbw) | Protective film | Width change |
|---|---|---|---|---|---|
| EB resist polymer (100) | PAG 2 (10) | Quencher 1 (0.4) | PGMEA(700) EL(300) | TC-11 | −2 nm |
| EB resist polymer (100) | PAG 2 (10) | Quencher 1 (0.4) | PGMEA(700) EL(300) | TC-12 | −1 nm |
| EB resist polymer (100) | PAG 2 (10) | Quencher 1 (0.4) | PGMEA(700) EL(300) | TC-13 | −1 nm |
| EB resist polymer (100) | PAG 2 (10) | Quencher 1 (0.4) | PGMEA(700) EL(300) | TC-14 | −1 nm |
| EB resist polymer (100) | PAG 2 (10) | Quencher 1 (0.4) | PGMEA(700) EL(300) | TC-15 | −1 nm |
| EB resist polymer (100) | PAG 2 (10) | Quencher 1 (0.4) | PGMEA(700) EL(300) | TC-16 | −1 nm |
| EB resist polymer (100) | PAG 2 (10) | Quencher 1 (0.4) | PGMEA(700) EL(300) | TC-17 | −1 nm |
| EB resist polymer (100) | PAG 2 (10) | Quencher 1 (0.4) | PGMEA(700) EL(300) | TC-18 | −1 nm |
| EB resist polymer (100) | PAG 2 (10) | Quencher 1 (0.4) | PGMEA(700) EL(300) | TC-19 | −1 nm |
| EB resist polymer (100) | PAG 2 (10) | Quencher 1 (0.4) | PGMEA(700) EL(300) | TC-20 | −1 nm |
| EB resist polymer (100) | PAG 2 (10) | Quencher 1 (0.4) | PGMEA(700) EL(300) | TC-21 | −1 nm |
| EB resist polymer (100) | PAG 2 (10) | Quencher 1 (0.4) | PGMEA(700) EL(300) | TC-22 | −1 nm |
| EB resist polymer (100) | PAG 2 (10) | Quencher 1 (0.4) | PGMEA(700) EL(300) | TC-23 | −1 nm |
| EB resist polymer (100) | PAG 2 (10) | Quencher 1 (0.4) | PGMEA(700) EL(300) | — | −9 nm |

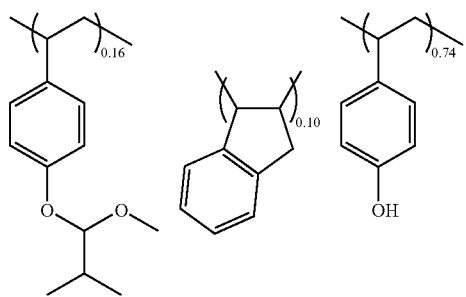

EB resist polymer
Mw 13,600
Mw/Mn 1.86

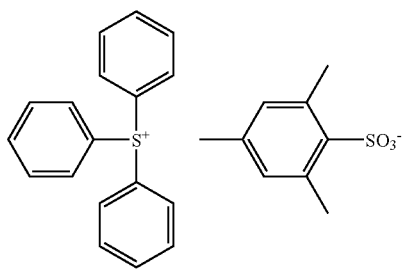

PAG 2

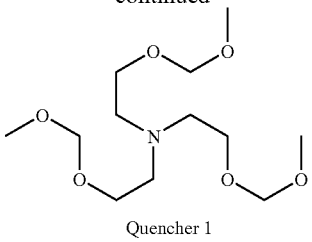

Quencher 1

In the ArF lithography process, the resist took a T-top profile when water rinsing after exposure was conducted in the absence of protective coating. This is presumably because the acid was dissolved in water. In the presence of a protective coating according to the invention, no profile change occurred. In the case of a protective coating of a polymer having only hexafluoroalcohol groups of the prior art type as the dissolvable group, the resist profile as developed became slimmed and tapered.

A protective coating of a polymer comprising repeat units having hexafluoroalcohol groups with an ester moiety bonded at the beta-position relative to the alcohol moiety according to the invention has advantages including a high alkali dissolution rate, few defects on dry exposure, and improved water slippage and hence, minimized defects like water marks when processed by the immersion lithography.

In the EB exposure, the use of a resist protective coating according to the invention improves the stability of a resist during vacuum holding after exposure.

Japanese Patent Application Nos. 2006-022351 and 2006-232910 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.
The invention claimed is:
1. A resist protective coating material comprising a polymer comprising repeat units having any one of the following formulae group (i) to (xiv):
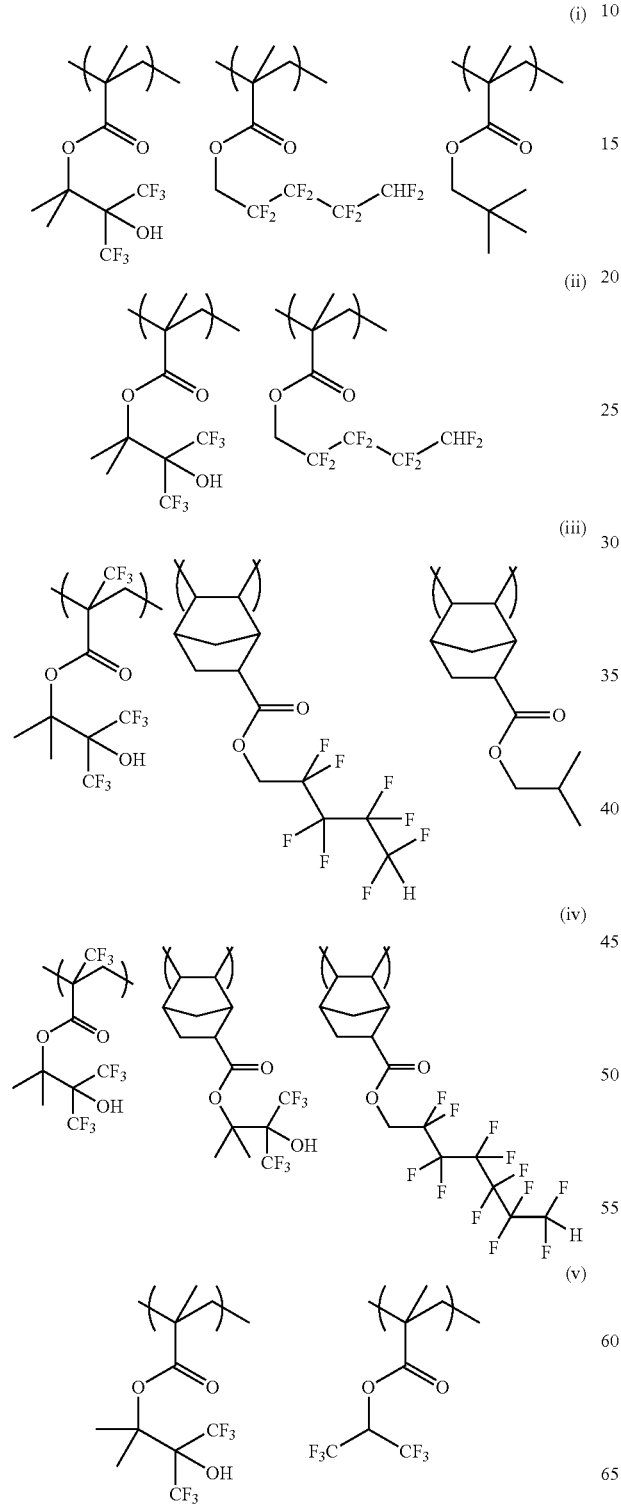
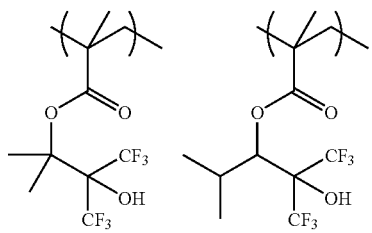
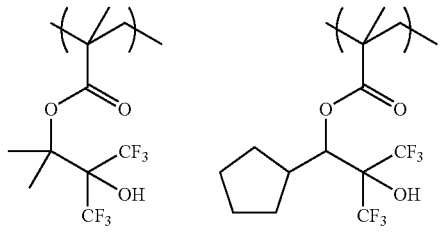
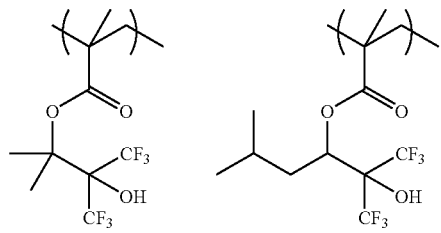
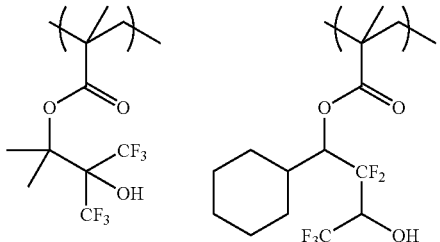
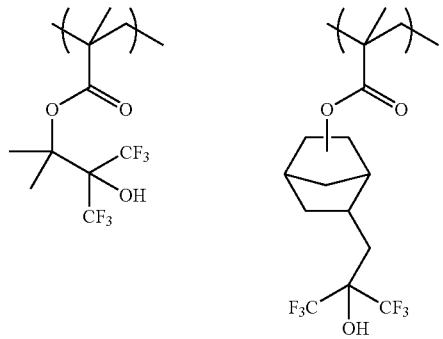

-continued

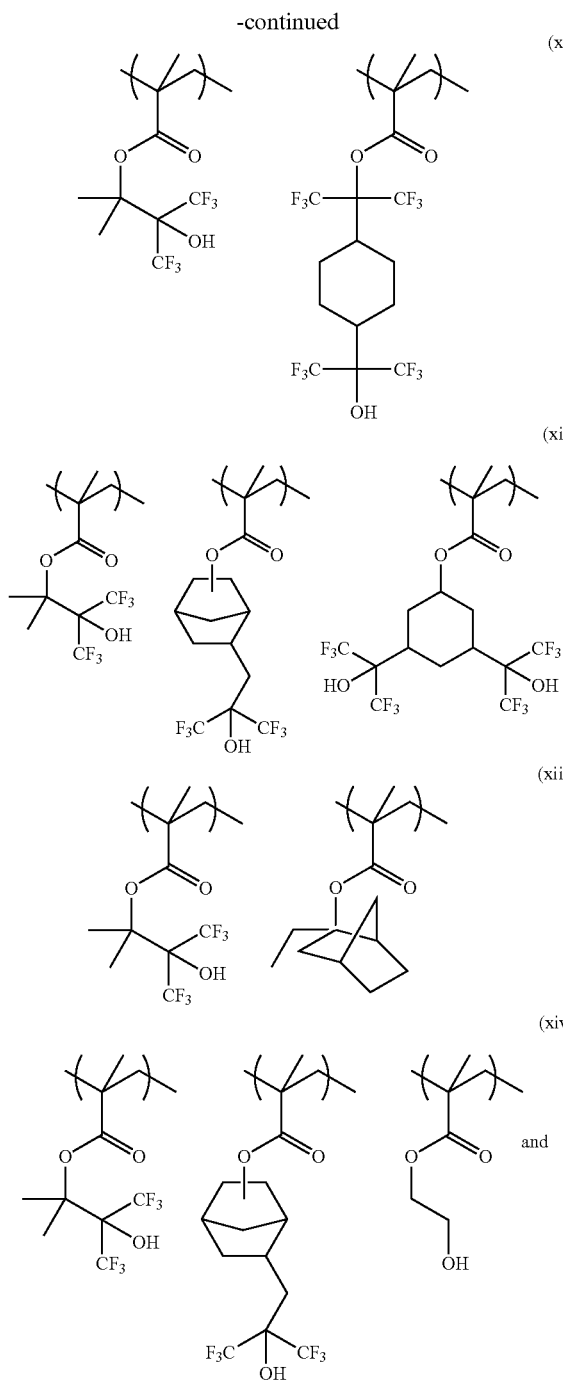

a solvent comprising di-n-pentyl ether, diisopentyl ether or a mixture thereof.

2. The resist protective coating material of claim 1, wherein said polymer further comprises repeat units of one or more type selected from repeat units containing carboxyl groups, repeat units containing fluoroalcohol other than the following formula (3), and repeat units containing fluoroalkyl or alkyl groups:

wherein $R^1$ and $R^2$ each are hydrogen or a straight, branched or cyclic $C_1$-$C_{12}$ alkyl group, or $R^1$ and $R^2$ may bond together to form a ring with the carbon atom to which they are attached, $R^3$ and $R^6$ each are hydrogen, fluorine, methyl or trifluoromethyl, X' is —O—, —C(O)—O— or —C(O)—O—$R^7$—C(=O)—O—, wherein $R^7$ is a straight, branched or cyclic $C_1$-$C_{10}$ alkyl group, and the subscripts "c" and "d" are numbers in the range: $0 \leq c \leq 1$, $0 \leq d \leq 1$, and $0 < c+d \leq 1$.

3. The resist protective coating material of claim 1, wherein said solvent further comprises 0.1 to 90% by weight of a higher alcohol of 4 to 10 carbon atoms in admixture with said di-n-pentyl ether, said diisopentyl ether or said mixture thereof.

4. A lithography process for forming a pattern, comprising the steps of forming a protective coating on a photoresist layer disposed on a wafer from a resist overlay material, exposing the layer structure to light, and developing, said resist overlay material being the resist protective coating material of claim 1.

5. An immersion lithography process for forming a pattern, comprising the steps of forming a protective coating on a photoresist layer disposed on a wafer from a resist overlay material, exposing the layer structure in water to light, and developing, said resist overlay material being the resist protective coating material of claim 1.

6. The process of claim 5, wherein the exposing step includes irradiating light having a wavelength in the range of 180 to 250 nm to the layer structure through a projection lens while keeping water between the projection lens and the wafer.

7. The process of claim 5, wherein the developing step is to develop the photoresist layer and strip the protective coating of resist overlay material at the same time, using a liquid alkaline developer.

8. A lithography process for forming a pattern, comprising the steps of forming a protective coating on a photoresist layer disposed on a mask blank from a resist overlay material, exposing the layer structure in vacuum to electron beam, and developing, said resist overlay material being the resist protective coating material of claim 1.

* * * * *